(12) United States Patent
Sakakura

(10) Patent No.: US 7,030,611 B2
(45) Date of Patent: Apr. 18, 2006

(54) MAGNETIC RESONANCE IMAGING APPARATUS AND METHOD INCORPORATING MULTI-MODE GRADIENT COIL UNIT

(75) Inventor: Yoshitomo Sakakura, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/744,075

(22) Filed: Dec. 24, 2003

(65) Prior Publication Data

US 2004/0150402 A1    Aug. 5, 2004

(30) Foreign Application Priority Data

Dec. 27, 2002 (JP) .............................. 2002-381384
Aug. 4, 2003 (JP) .............................. 2003-205734

(51) Int. Cl.
  *G01V 3/00*    (2006.01)
(52) U.S. Cl. ....................................... 324/318; 324/309
(58) Field of Classification Search ................. 324/318, 324/322, 319, 309, 311, 307, 300; 335/299; 600/410
See application file for complete search history.

(56) References Cited

U.S. PATENT DOCUMENTS

| 4,737,716 | A  |    | 4/1988  | Roemer |
| 5,311,135 | A  |    | 5/1994  | Vavrek |
| 5,736,858 | A  |    | 4/1998  | Katznelson |
| 6,236,208 | B1 | *  | 5/2001  | Ham et al. .................. 324/318 |
| 6,501,977 | B1 | *  | 12/2002 | Kimmlingen ............... 600/410 |
| 6,794,873 | B1 | *  | 9/2004  | Brand et al. ................ 324/319 |

* cited by examiner

*Primary Examiner*—Brij Shrivastav
(74) *Attorney, Agent, or Firm*—Nixon & Vanderhye P.C.

(57) ABSTRACT

A gradient coil or shield coil includes a first gradient coil part and a second gradient coil part having at least one different characteristic of (a) intensity of gradient magnetic field, (b) slew rate, (c) linearity and/or (d) changing rate of the magnetic field (as compared to characteristics of the first gradient coil part. In another aspect, a gradient coil includes a first portion close to a center of the gradient coil, a second portion which is outside of the first portion and which has a lower winding density than the first portion and a third portion which is outside of the second portion and which has a higher winding density than the second portion.

28 Claims, 36 Drawing Sheets

SHIELD COIL PATTERN IN FULL MODE

SHIELD COIL PATTERN ONLY FOR RIM MODE COIL

FULL MODE COIL PATTERN

SHIELD COIL PATTERN FOR FULL MODE COIL

MAGNETIC RESONANCE IMAGING APPARATUS AND METHOD INCORPORATING MULTI-MODE GRADIENT COIL UNIT

CROSS-REFERENCE TO RELATED APPLICATIONS

This application is based upon and claims the benefit of priority from prior Japanese Patent Application No. 2002-381384 filed on Dec. 27, 2002, and Japanese Patent Application No. 2003-205734 filed on Aug. 4, 2003, the entire contents of which are both hereby incorporated herein by reference.

FIELD OF THE INVENTION

The present invention relates generally to magnetic resonance imaging apparatus and method incorporating a multi-mode gradient coil unit.

BACKGROUND OF THE INVENTION

In magnetic resonance phenomenon, a group of nuclei with a magnetic moment are placed in a homogeneous static magnetic field. The nuclei absorb energy from a high frequency (RF) magnetic field rotating at a specific (Larmor) frequency, and emit the absorbed energy as an NMR response after the high frequency (RF) magnetic field is removed. In order to create an image of chemical or physical information in a living body using such a phenomenon, it is necessary to find the spatial position where the magnetic resonance response signal is created, and 2-Dimensional Fourier Transform (2DFT) method are common. By a typical 2DFT method, first, a high frequency (RF) pulse is imposed together with a gradient magnetic field for slice selection. Only nuclei in a specific slice volume is selectively excited, and a transverse relaxation magnetization of nuclei is generated. When a gradient magnetic field for phase encoding is impressed after the high frequency (RF) pulse, although the magnetization rotates at a frequency related to the magnetic field at a particular spatial position, even after the magnetic field is removed, the difference of the frequency is kept as a phase difference. While the gradient magnetic field for frequency encoding is impressed, the received nuclei magnetic resonance (NMR) response signal (echo signal) that is created from the transverse relaxation magnetization and that is picked up by a high frequency (RF) coil is amplified by a first amplifier, and is sampled by an analog-digital converter to output a digital signal. When the magnetization rotates at a frequency according to the magnetic field at the spatial location provided by the gradient magnetic field pulse for frequency encoding, the difference of the frequency is reflected in the frequency of the NMR echo signal. A plurality of echo signals are collected by repeatedly changing the phase encoding in successive such procedures. When Fourier transformation is performed on the collected echo signal f(t) along a frequency encoding axis, a projection $F(\omega x)$ along the spatial X-axis is obtained. When Fourier transformation is performed on the projection $F(\omega x)$ along a phase encoding axis, a spatial distribution $F(\omega x, \omega y)$ of the chemical or physical information in the living body is obtained. Thus, the gradient magnetic field pulse is used for encoding spatial position information in the NMR echo signal.

Recently, it is strongly required to improve spatial resolution and to shorten imaging time, and the gradient magnetic field is required to have larger magnetic field intensity, that is, a quicker response in spatial change of the magnetic field and a faster rising edge (slew rate). On the other hand, safety regulations restrict this parameter so that the maximum permissible rate of changing the magnetic field (dB/dt) (for permissible values of peripheral nerve stimulus) decreases. When the magnetic field intensity and the slew rate are high, the rate of changing the magnetic field decreases and the range of linearity between the magnetic field intensity and spatial position becomes narrower.

Therefore, it is desirable to select a proper magnetic gradient coil, each of which has a coil pattern whose intensity characteristic, slew rate characteristic and linearity characteristic are different, within the permitted limitation for the change rate of the magnetic field (dB/dt). For example, U.S. Pat. No. 5,736,858 and U.S. Pat. No. 6,236,208 describe two kinds of coils that are put on two layers and one coil is alternatively selectively used according to the pulse sequence then being used for imaging. However, such a structure where two kinds of coils are put on two different layers can make the diameter of a patient access opening where a patient is inserted smaller, and can thus decrease available access space and can make it difficult to properly access the patient. Moreover, U.S. Pat. No. 5,311,135 describes a terminal that is provided partway along a single gradient coil and the gradient coil part associated therewith is alternatively applied according to the size of an imaged body part.

SUMMARY OF THE INVENTION

One object of the present invention is to ameliorate the above-mentioned problems. To that end, according to one aspect of the present invention, there is provided an exemplary magnetic resonance imaging apparatus which includes a static magnetic field coil configured to impress a static magnetic field on an object; a gradient coil unit including a plurality of gradient coils configured to impress gradient magnetic fields on the object; an RF coil configured to receive a magnetic resonance signal from the object; and an operation unit configured to create image data based on the magnetic resonance signal; wherein each gradient coil includes:

a first gradient coil part; and a second gradient coil part having at least one of the following characteristics different than the corresponding characteristic of the first gradient coil part:

(a) intensity of gradient magnetic field, (b) slew rate, (c) linearity and (d) changing rate of the magnetic field.

The exemplary magnetic field coil unit gradient coils may each include a first gradient coil part and a second gradient coil part that are located on a single layer and a plurality of shield coils, corresponding to the respective gradient coils, each of which includes a first shield coil part and a second shield coil part that are located on a single layer, the first shield coil part overlapping the second shield coil part.

The exemplary magnetic resonance imaging apparatus also may simply be a gradient coil unit including a plurality of gradient coils; wherein each gradient coil comprises: a first gradient coil part; and a second gradient coil part having at least one of the characteristics of (a) intensity of gradient magnetic field, (b) slew rate, (c) linearity and (d) changing rate of the magnetic field that is different from the corresponding characteristics of the first gradient coil part.

The exemplary magnetic resonance imaging apparatus having gradient coils and shield coils as well as an RF coil and an operation control unit may have each gradient coil including a plurality of gradient coil parts that are located on a respectively corresponding single layer and each shield coil corresponds to a respective gradient coil part and is located on a different layer.

The exemplary magnetic resonance imaging apparatus having a plurality of gradient coils and a plurality of shield coils as well as an RF coil and an operation control unit may have each gradient coil including a plurality of gradient coil parts that are located on a respective single layer where each shield coil also includes a first shield coil part and a second shield coil part that are located on a respective single layer, the first shield coil part overlapping the second shield coil part.

An exemplary gradient coil unit may have a coil with a first portion centrally located within the gradient coil; a second portion located outside of the first portion and having a lower winding density than the first portion; and a third portion located outside of the second portion and having a higher winding density than the second portion.

The exemplary magnetic resonance imaging apparatus may include a static magnetic field coil, a gradient coil unit including a gradient coil, an RF coil and an operation control unit configured to create image data based on the magnetic resonance signal; wherein the gradient coil includes a first portion, centrally located within the gradient coil; a second portion located outside of the first portion and having a lower winding density than the first portion; and a third portion located outside of the second portion and which has a higher winding density than the second portion.

BRIEF DESCRIPTION OF THE DRAWINGS

A more complete appreciation of the invention and many of the attendant advantages thereof will be readily obtained as the same becomes better understood by reference to the detailed description when considered in connection with the accompanying drawings. In the drawings.

DETAILED DESCRIPTION OF EXEMPLARY EMBODIMENTS OF THE INVENTION

Figure 1:
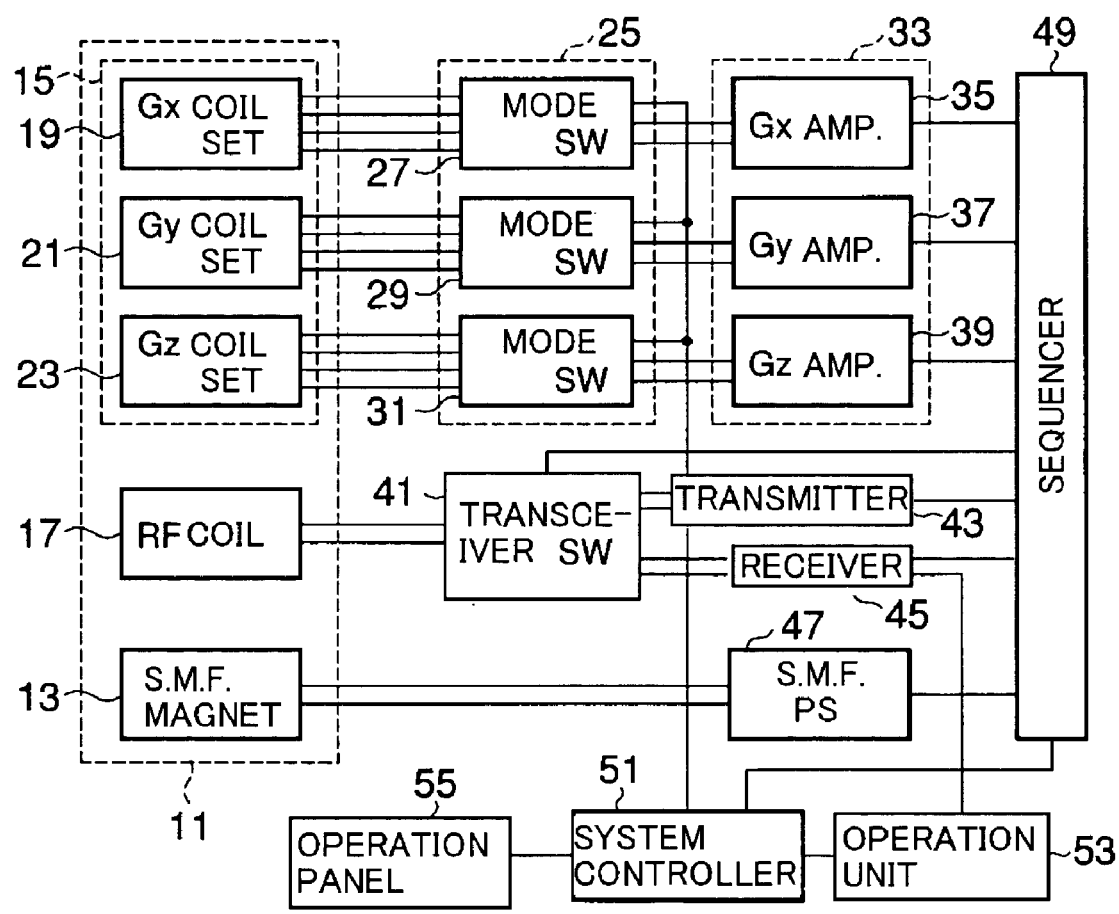
FIG. 1 is a block diagram of a magnetic resonance imaging apparatus including a gradient coil unit in a first embodiment.

With reference to drawings, a first embodiment of a gradient coil unit and a magnetic resonance imaging apparatus are explained. FIG. 1 shows a block diagram of the magnetic resonance imaging apparatus that has a gradient coil unit according to the first embodiment. A magnet unit 11 has an approximately cylindrically shaped imaging space (opening). At the time of imaging, a patient laid on a bed plate is inserted into the imaging space. Rectilinear orthogonal three dimensional axes (XYZ) are defined as below for explanation. The Z-axis corresponds to a center axis of the opening. The magnet unit 11 includes a static magnet 13, a gradient magnetic field coil unit 15 and an RF coil 17. The gradient coil unit 15 is located inside the static magnetic field magnet 13. The RF coil 17 is located inside the gradient coil unit 15. A static magnetic field power supply 47 supplies current to the static magnetic field magnet 13. Thereby, the imaging space is filled with static magnetic field. The direction of the static magnetic field is parallel to the Z-axis.

The gradient coil unit 15 has a Gx coil set 19, a Gy coil set 21 and a Gz coil set 23 that correspond to X, Y and Z axes, respectively. The Gx coil set 19 changes the static magnetic field Z-axis intensity along the X-axis. The Gy coil set 21 changes the static magnetic Z-axis field intensity along the Y-axis. The Gz coil set 23 changes the static magnetic field Z-axis intensity along the Z-axis. The Gx coil set 19 is connected to a Gx amplifier 35 of a gradient magnetic field amplifier set 33 through a mode changing switch 27 of a mode changing switch set 25. The Gy coil set 21 is connected to a Gy amplifier 37 through a mode changing switch 29. The Gz coil set 23 is connected to a Gz amplifier 39 through a mode changing switch 31.

The RF coil 17 is connected to a transmitter 43 by a transceiver changeover switch 41 for RF transmission. The RF coil 17 is connected to a receiver 45 by the transceiver changing switch 41 for RF reception. The transmitter 43 supplies a high frequency (RF) current pulse to the RF coil 17. Thereby, the RF coil 17 generates a high frequency magnetic field pulse. The receiver 45 receives an NMR MR response signal (a free induction (FID) signal or an echo signal (e.g., SE, GE, etc.) through the RF coil 17. The receiver 45 amplifies and demodulates the received MR signal and changes it into a digital signal. An operation unit 53 generates image data by 2-dimensional Fourier Transformation processing from the digital signal outputted from the receiver 45.

A sequencer 49 controls the amplifiers 35, 37 and 39, the transmitter 23 and the receiver 45 according to a selected imaging pulse sequence. A system controller 51 controls operation of the whole apparatus. An operation panel 55 is connected to the system controller 51. The operation panel 55 has a button for an operator to use in changing the operating mode of the gradient magnetic field coils. When the mode is changed, at least one characteristic of the gradient field is changed: (a) intensity of the gradient magnetic field (b), the slew rate (c), the linearity and/or (d) the changing rate of the magnetic field. A rim mode and a full mode are utilized in the first exemplary embodiment. The system controller 51 controls the mode changing switches 27, 29 and 31 according to the mode selected by the mode change button.

Figure 2:
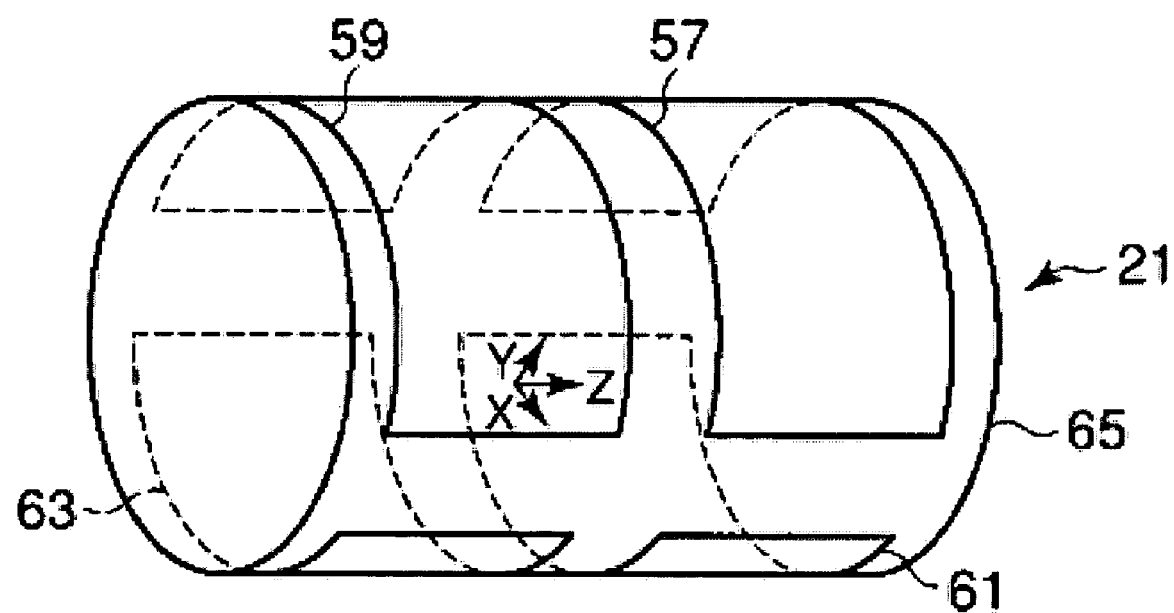
FIG. 2 is a view of a Gy coil set of FIG. 1.
Figure 3:
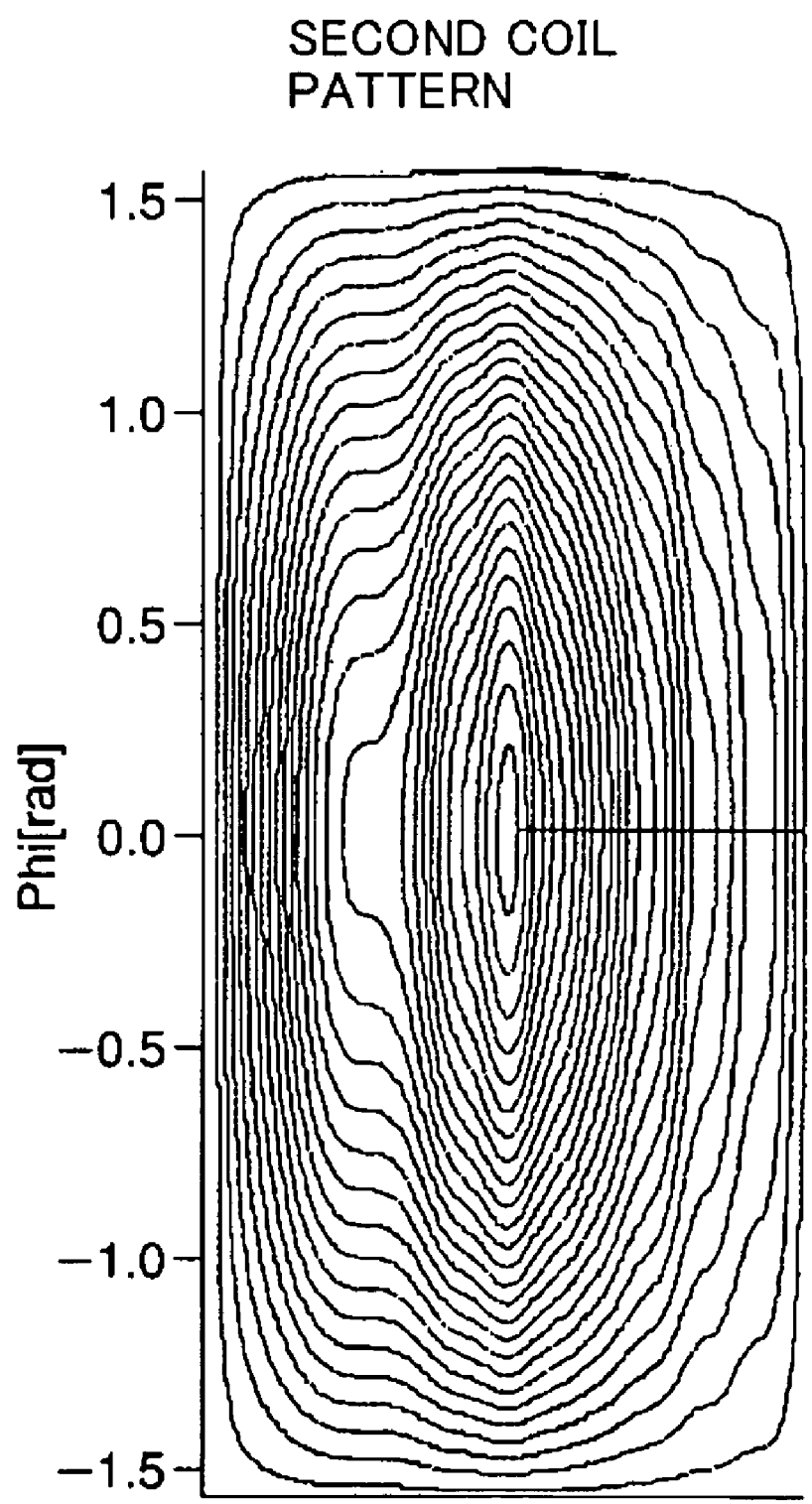
FIG. 3 is a schematic illustration of a second coil winding pattern of a part of the Gy coil of FIG. 2.
Figure 4:
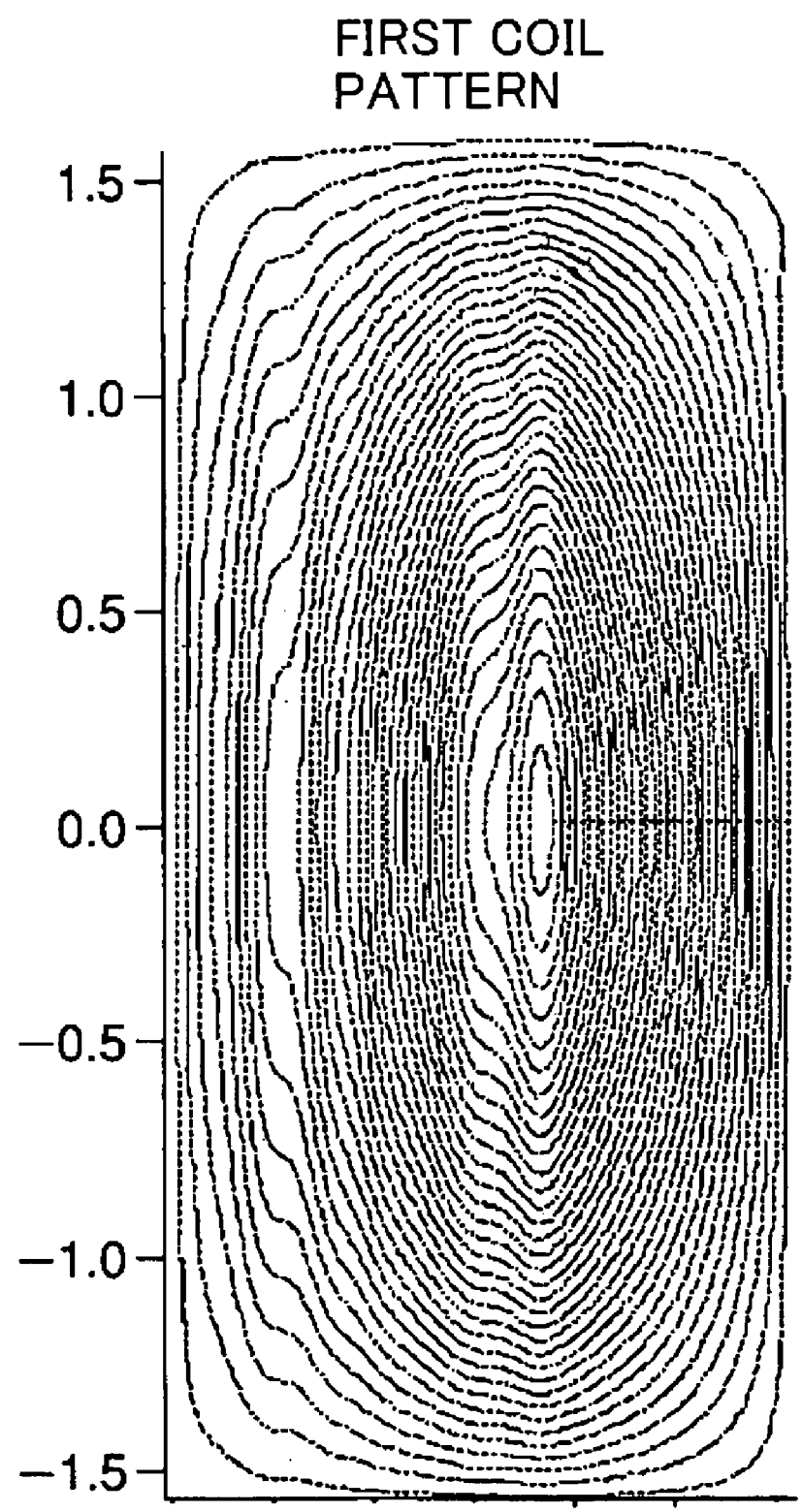
FIG. 4 is a schematic illustration of a first coil winding pattern of another part of the Gy coil of FIG. 2.
Figure 5:
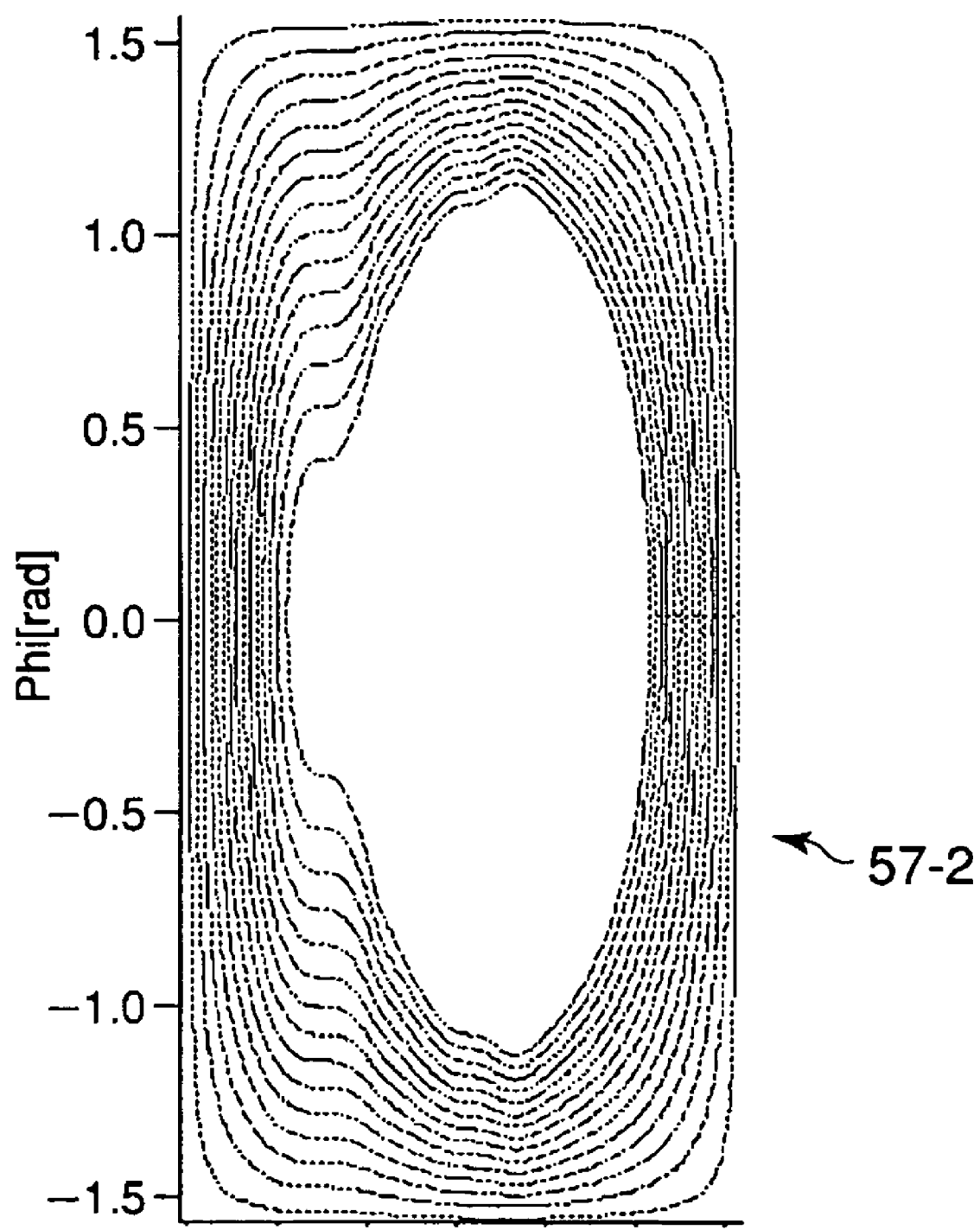
FIG. 5 is schematic illustration of a second coil part of the Gy coil of FIG. 2.
Figure 6:
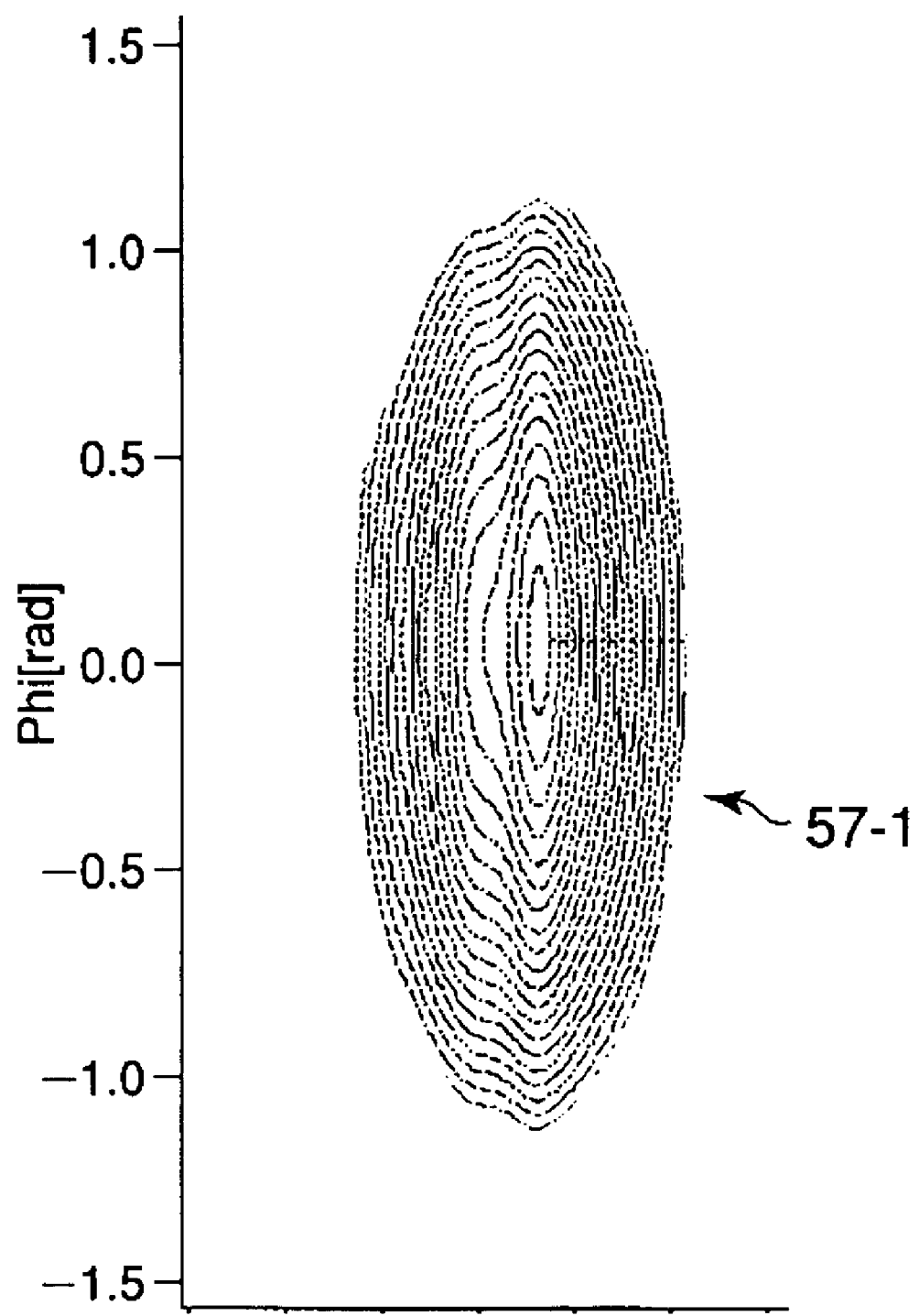
FIG. 6 is a schematic illustration of a first coil part of the Gy coil of FIG. 2.
Figure 7:
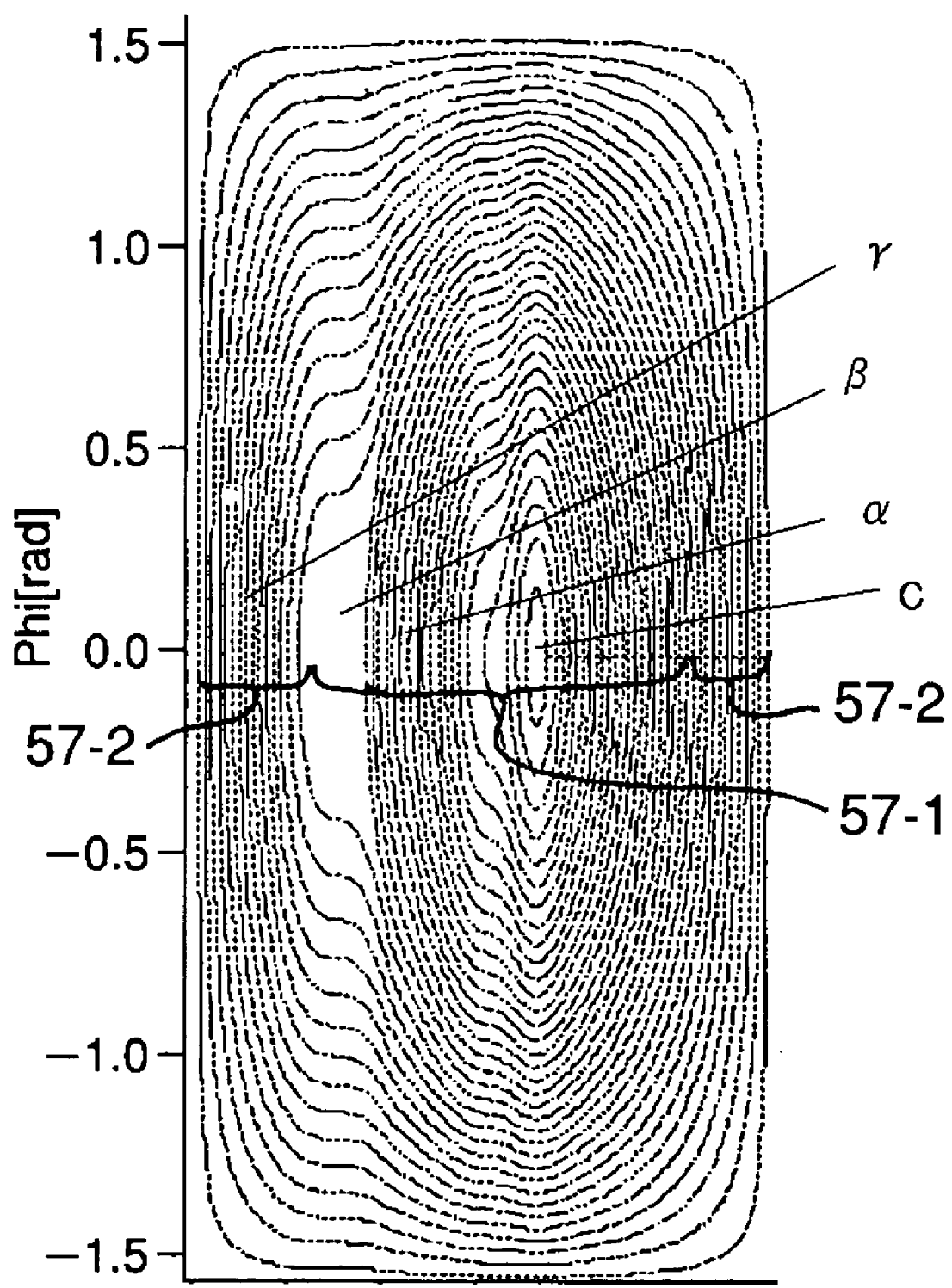
FIG. 7 is a schematic illustration of a coil winding pattern of the Gy coil including the second coil part of FIG. 5 and the first coil part of FIG. 6.

The Gy coil set 21 is shown in FIG. 2. Since the Gx coil set 19 is the same as or similar to the Gy coil sets 21 but rotated by 90° about the Z-axis, detailed explanation of Gx is omitted. The Gy coil set 21 has a plurality of surface type main coils 57, 59, 61 and 63. The coils 57 and 61 in pairs are located so as to face with each other, and XZ plane is therebetween. The coils 59 and 63 in pairs are located so as to face with each other, and XZ plane is therebetween. The coil 59 is symmetrically arranged to the coil 57 across XY plane. The coil 63 is symmetrically arranged to the coil 61 across XY plane. Two coil patterns which have at least one different characteristic of (a) the intensity of the gradient magnetic field (b), the slew rate (c), the linearity and/or (d) the changing rate of the magnetic field to each other are shown in FIG. 3 and FIG. 4. A first coil pattern shown in FIG. 4 has higher gradient magnetic field intensity characteristic (slope is sharp), higher slew rate characteristic (standup time is short), lower linearity characteristic (linear range is narrow) and lower changing rate of the magnetic field in comparison with a second coil pattern shown in FIG. 3. Conversely, the second coil pattern shown in FIG. 3 has lower gradient magnetic field intensity characteristic, lower slew rate characteristic, higher linearity characteristic and higher changing rate of the magnetic field in comparison with the first coil pattern shown in FIG. 4. The winding density of the second coil pattern is lower than that of the first coil pattern, and the number of windings is fewer. The coil 57 includes first and second coil parts 57-1 and 57-2. Other coils 59, 61 and 63 include respective first and second coil parts as well. The first coil part 57-1 has a first coil pattern. The second coil part 57-2 has a second coil pattern. As a coil pattern of the coil 57, the first coil part 57-1 corresponds to a center part of the first coil pattern shown in FIG. 6. The second coil part 57-2 corresponds to a peripheral part of the second coil pattern shown in FIG. 5. As shown in FIG. 7, the second coil part 57-2 surrounds the first coil part 57-1. The first coil part 57-1 and the second coil part 57-2 are located on a single layer. That is, the first coil part 57-1 and second coil part 57-2 are printed on the same surface of a coil cylinder 65. Other coils 59, 61 and 63 are the same as or similar to the coil 57. Combining the first coil part 57-1 and the second coil part 57-2, a portion α that is close to a center C of the coil has a higher winding density than a portion β that is outside of the portion α, and a portion γ that is outside of the portion β has a higher winding density than the portion β as one example. However, such a relation of the densities is merely exemplary.

Figure 8:
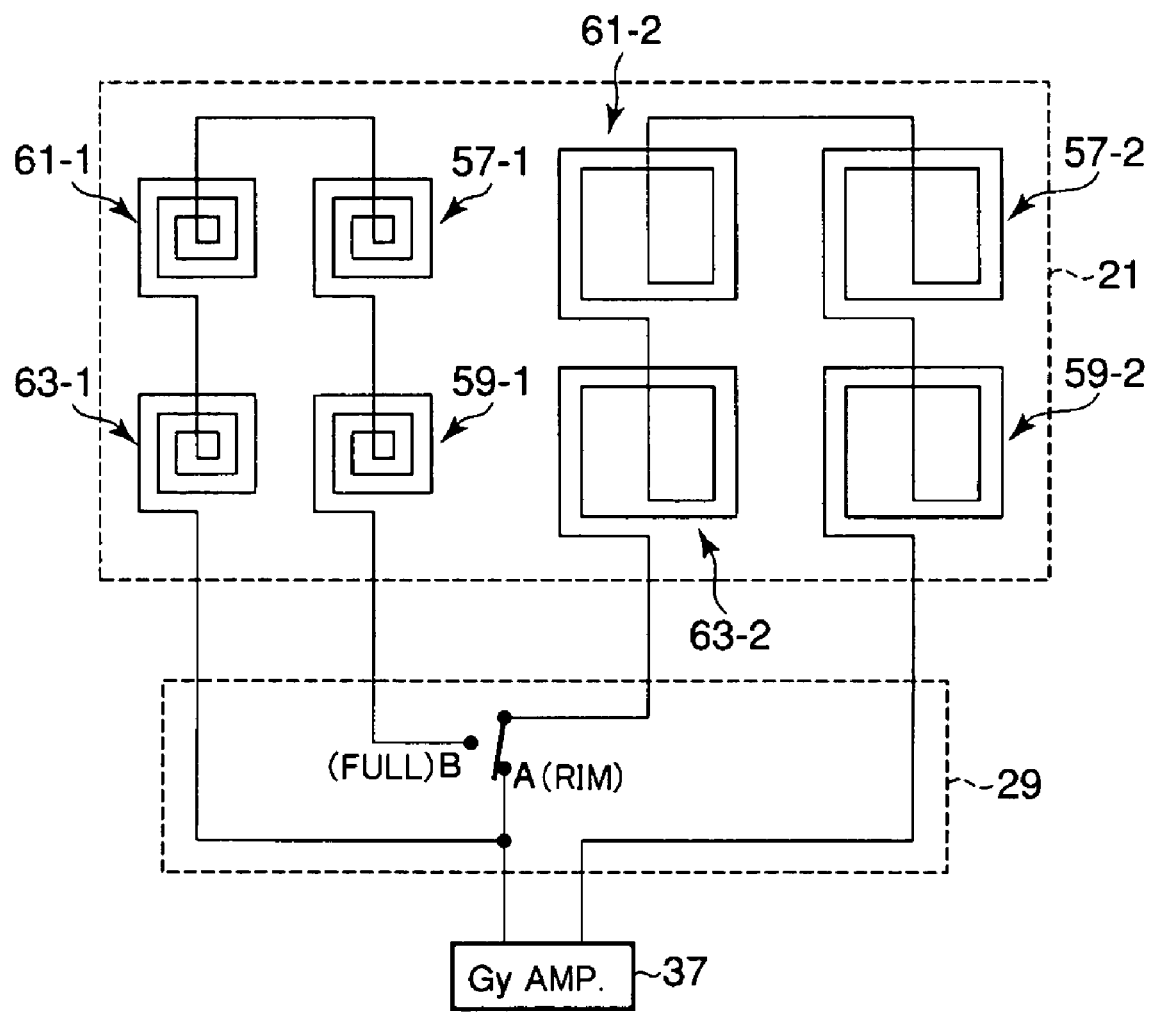
FIG. 8 is a schematic illustration of the Gy coil set of FIG. 1, a mode changing switch and a Gy amplifier.
Figure 9:
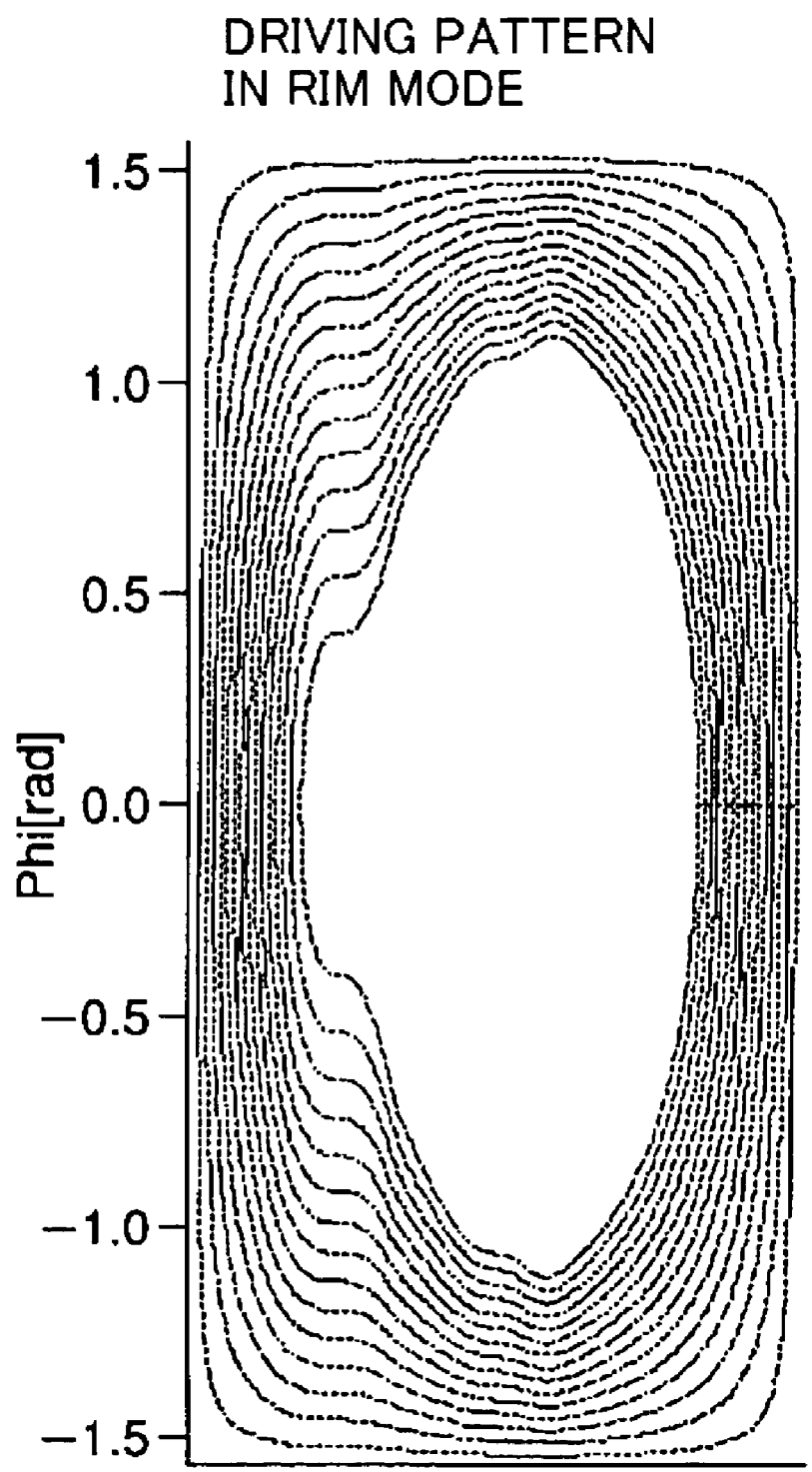
FIG. 9 is a schematic illustration of a rim mode pattern of driven conductors of the Gy coil of FIG. 2.

Electrical connections of the main coils 57, 59, 61 and 63 of the Gy coil set 21, the mode changing switch 29 and the Gy amplifier 37 are shown in FIG. 8. The first coil parts 57-1, 59-1, 61-1 and 63-1 of the main coils 57, 59, 61 and 63 are connected in series. Similarly, the second coil parts 57-2, 59-2, 61-2 and 63-2 of coils 57, 59, 61 and 63 are connected in series. When the mode changing switch 29 is connected to a terminal A, the second coil parts 57-2, 59-2, 61-2 and 63-2 are connected in series to the Gy amplifier 37. At this time, the first coil part 57-1, 59-1, 61-1 and 63-1 are electrically separated from the Gy amplifier 37. The first coil part 57-1, 59-1, 61-1 and 63-1 located on the center of each coils 57, 59, 61 and 63, do not generate magnetic fields, but the second coil parts 57-2, 59-2, 61-2 and 63-2 corresponding to a rim, generate magnetic fields. The state of operation is referred as a rim mode (FIG. 9).

Figure 10:
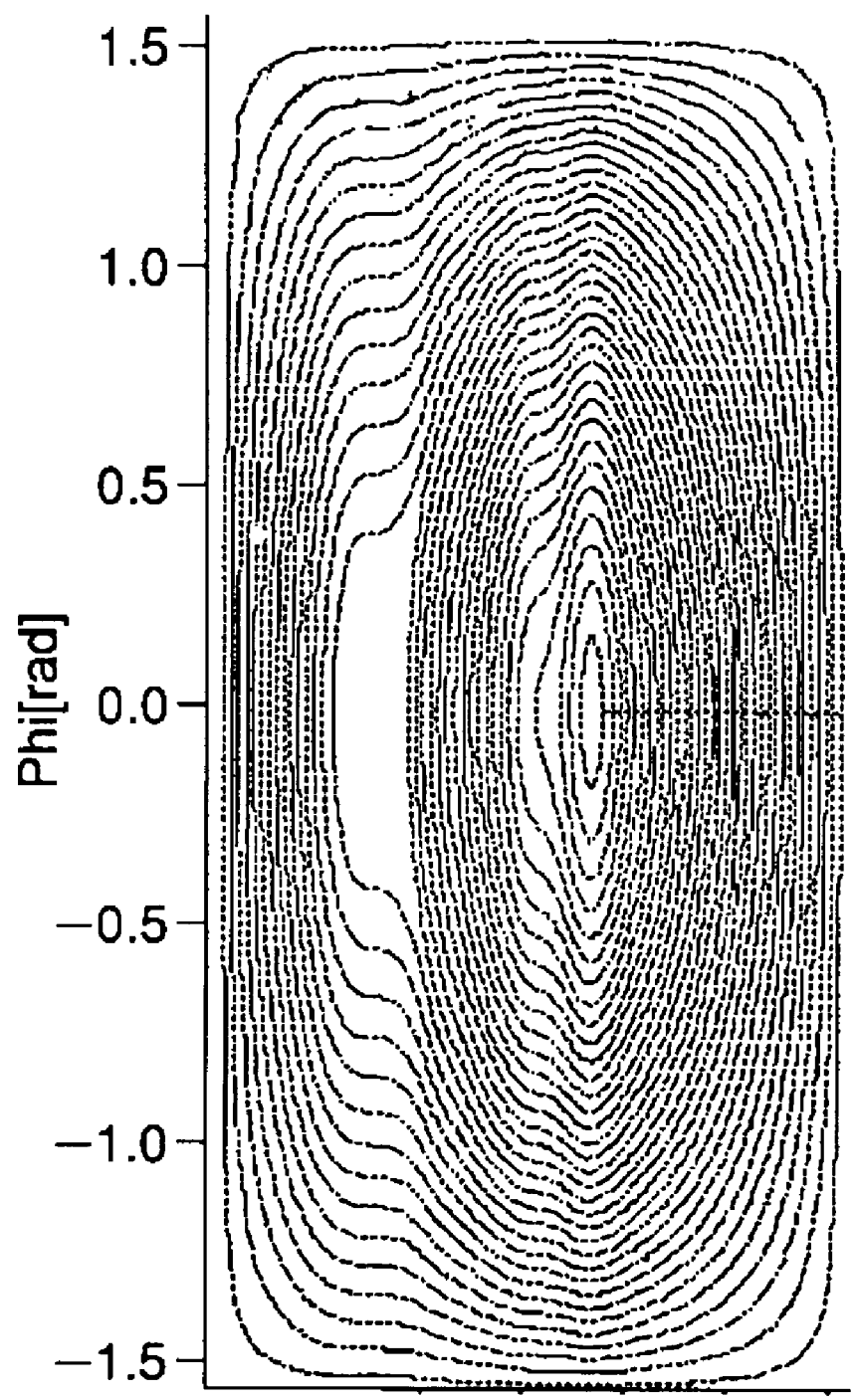
FIG. 10 is a schematic illustration of a full mode pattern of driven conductors of the Gy coil of FIG. 2.

When the mode changing switch 29 is connected to a terminal B, the second coil parts 57-2, 59-2, 61-2 and 63-2 corresponding to the rim of the coils 57, 59, 61 and 63 and the first coil parts 57-159-1, 61-1 and 63-1 corresponding to the center of the coils 57, 59, 61 and 63 are connected in series to the Gy amplifier 37. At this time, the first coil parts 57-159-1, 61-1 and 63-1 and the second coil parts 57-2, 59-2, 61-2 and 63-2 generate magnetic fields in combination. This state of operation is referred as a full mode (FIG. 10). In the rim mode, the second coil parts 57-2, 59-2, 61-2 and 63-2 of the rim of the coils 57, 59, 61 and 63 are driven, and the gradient magnetic field is generated using the characteristic(s) which the second coil pattern has, such as a high magnetic field intensity characteristic, a high slew rate characteristic, a low linearity characteristic (linear range is narrow) and a low changing rate of the magnetic field characteristic.

On the other hand, both the first coil parts 57-1, 59-1, 61-1, 63-1 and the second coil parts 57-2 59-2, 61-2 and 63-2 are driven, and the characteristic of each coil pattern complements the other in the full mode. That is, in the full mode, the gradient magnetic field has a high magnetic field intensity characteristic, a low slew rate characteristic, a medium linearity characteristic and a medium changing rate for the magnetic field. Thus, by selecting from the two modes (rim and full) different gradient magnetic fields can be generated, even though they are realized by a single layer winding. Therefore, the diameter of the patient opening hole where the patient is inserted can be kept wide. Thus, the space is not narrowed and access to the patient is not substantially restricted.

Figure 11:
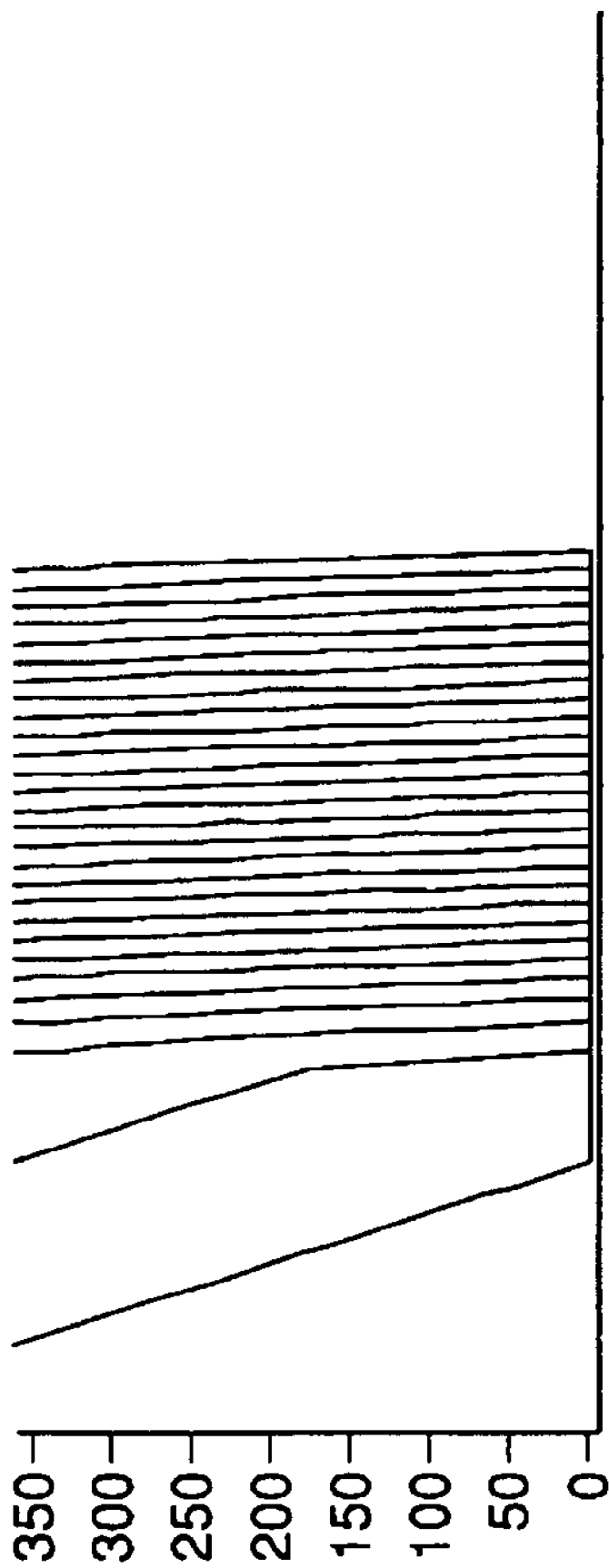
FIG. 11 is a schematic illustration of a second coil part of the Gz coil of FIG. 1.
Figure 12:
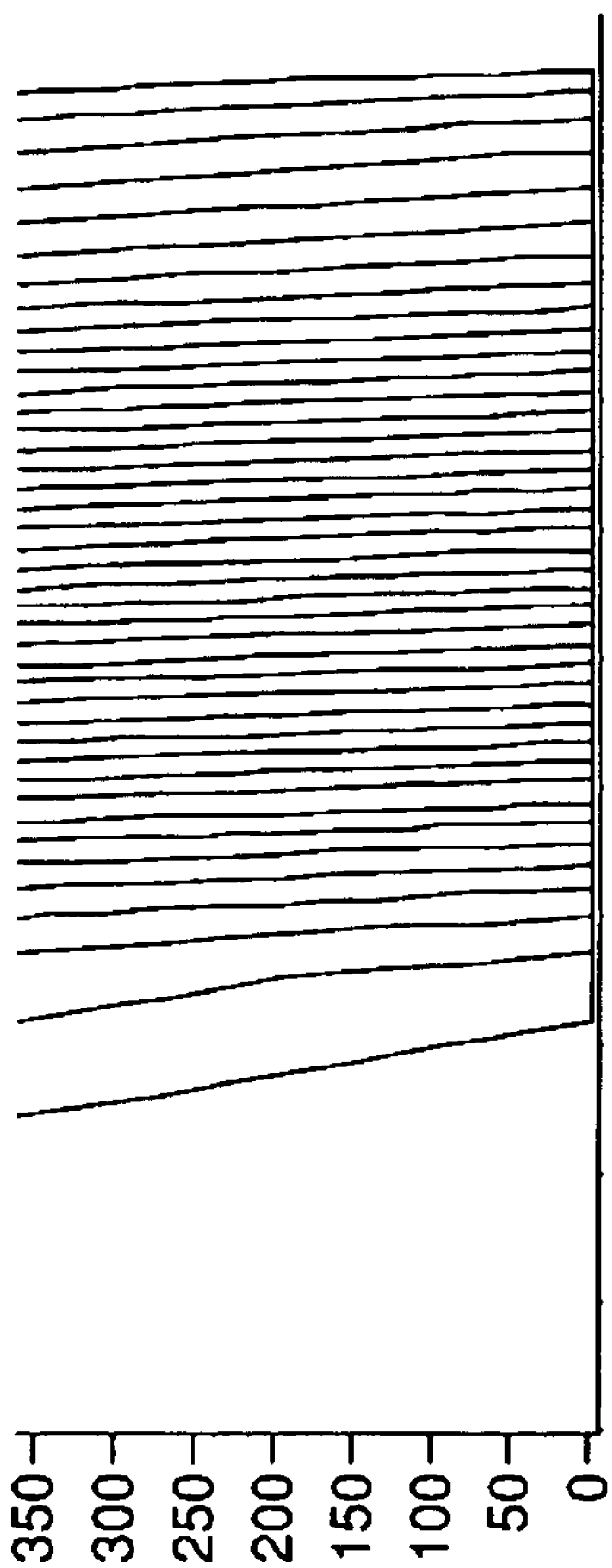
FIG. 12 is a schematic illustration of a first coil part of the windings of a Gz coil of FIG. 1.

A plurality of solenoidal coils of the Gz coil set 23 are shown in FIG. 11 and FIG. 12. These two coil patterns have at least one different characteristic of (a) magnetic field intensity, (b) slew rate, (c) linearity and/or (d) changing rate of magnetic field. As compared with a second coil pattern shown in FIG. 12, a first coil pattern shown in FIG. 11 has relatively high gradient magnetic field intensity characteristic (slope is sharp), high slew rate characteristic (standup time is short), low linearity characteristic (linear range is narrow) and low changing rate of the magnetic field. Conversely, as compared with the first coil pattern shown in FIG. 11, the second coil pattern shown in FIG. 12 has relatively low gradient magnetic field intensity characteristic, low slew rate characteristic, high linearity characteristic and high changing rate of the magnetic field. The winding density of the second coil pattern is lower than that of the first coil pattern, and the number of windings is more than that of the first coil pattern.

Figure 13:
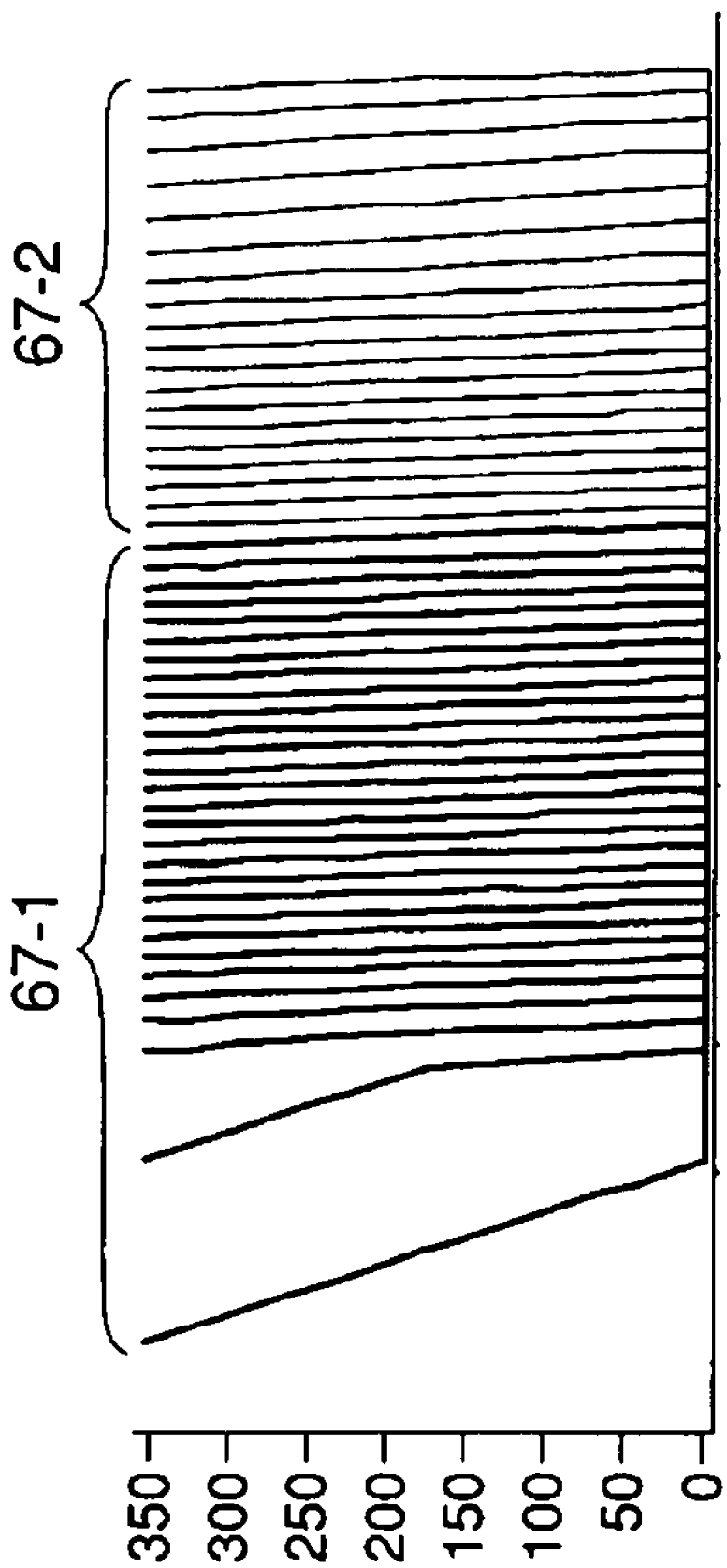
FIG. 13 is a schematic illustration of the coil pattern of the windings of a Gz coil including the second coil part of FIG. 11 and the first coil part of FIG. 12.

Each solenoid coil of the Gz coil set 23 has a coil pattern where the first and second coil patterns are partially combined. Each solenoid coil of the Gz coil set 23 includes a first coil part 67-1 which is a part of the first coil pattern shown in FIG. 11, and a second coil part 67-2 which is a part of the second coil pattern shown in FIG. 12. The first coil part 67-1 corresponds to an inside part of the first coil pattern, and the second coil part 67-2 corresponds to an outside part of the second coil pattern. As shown in FIG. 13, the first and the second coil parts 67-1 and 67-2 are located on a single layer, that is, they are printed on a surface of a single coil forming cylinder, so that the second coil part 67-2 axially outward of the first coil part 67-1 (along the Z-axis).

The electric connection to the mode changing switch 31 and the Gz amplifier 39 is the same as or similar to the connection shown in FIG. 8. The first coil part 67-1 of the solenoid coils of the Gz coil set 23 is connected in series. Similarly, the second coil part 67-2 of the solenoid coils of the Gz coil set 23 is connected in series. When the mode changing switch 29 is connected to one terminal, the second coil part 67-2 is connected in series to the Gy amplifier 39. At this time, the first coil part 67-1 is electrically separated from the Gz amplifier 39. At this time, the first coil part 67-1 does not generate a magnetic field, but the second coil part 67-2 generates the magnetic field. This state of operation is referred as the rim mode. When the mode changing switch 31 is connected to another terminal, the second coil part 67-2 and the first coil part 67-1 are connected in series to the Gz amplifier 39. At this time, the first and the second coil parts 67-1 and 67-2 generate magnetic fields in combination. This state of operation is referred as the full mode. In the rim mode, the second coil part 67-2 is driven, and the gradient magnetic field is generated wherein the second coil pattern has, a relatively high magnetic field intensity characteristic, a high slew rate characteristic, a low linearity characteristic (linear range is narrow) and a low changing rate for the magnetic field. On the other hand, both the first and the second coil parts 67-1 and 67-2 are driven, and the two kinds of coil patterns complement each other in the full mode. That is, in the full mode, the gradient magnetic field of high magnetic field intensity characteristic, low slew rate characteristic, medium linearity characteristic and medium changing rate of magnetic field is generated.

Thus, by selecting between two modes that are the rim mode and the full mode, different gradient magnetic field characteristics can be generated from a single layer winding. Therefore, the diameter of the patient opening where the patient is inserted can be kept wide. Thus, the space is not narrowed, and access to the patient is not substantially restricted.

As described above, one can separately switch each characteristic of the Gx coil set, the Gy coil set and the Gz coil set, each of which is on a single layer. Therefore, as compared with a multi-layer type coil, the diameter of the patient opening where the patient is inserted can be kept wide. Thus, the space is not narrowed, and the access to the patient is not substantially restricted. The effect is maximally achieved when each coil set of the Gx coil sets, Gy coil set and the Gz coil set is made as a respective single layer. However, some benefit is realized when at least one coil set is made as a single layer. Moreover, although it is explained that the exemplary coil is created by combining two kinds of coil patterns which have different characteristics, each coil may include three or more coil patterns.

Figure 14:
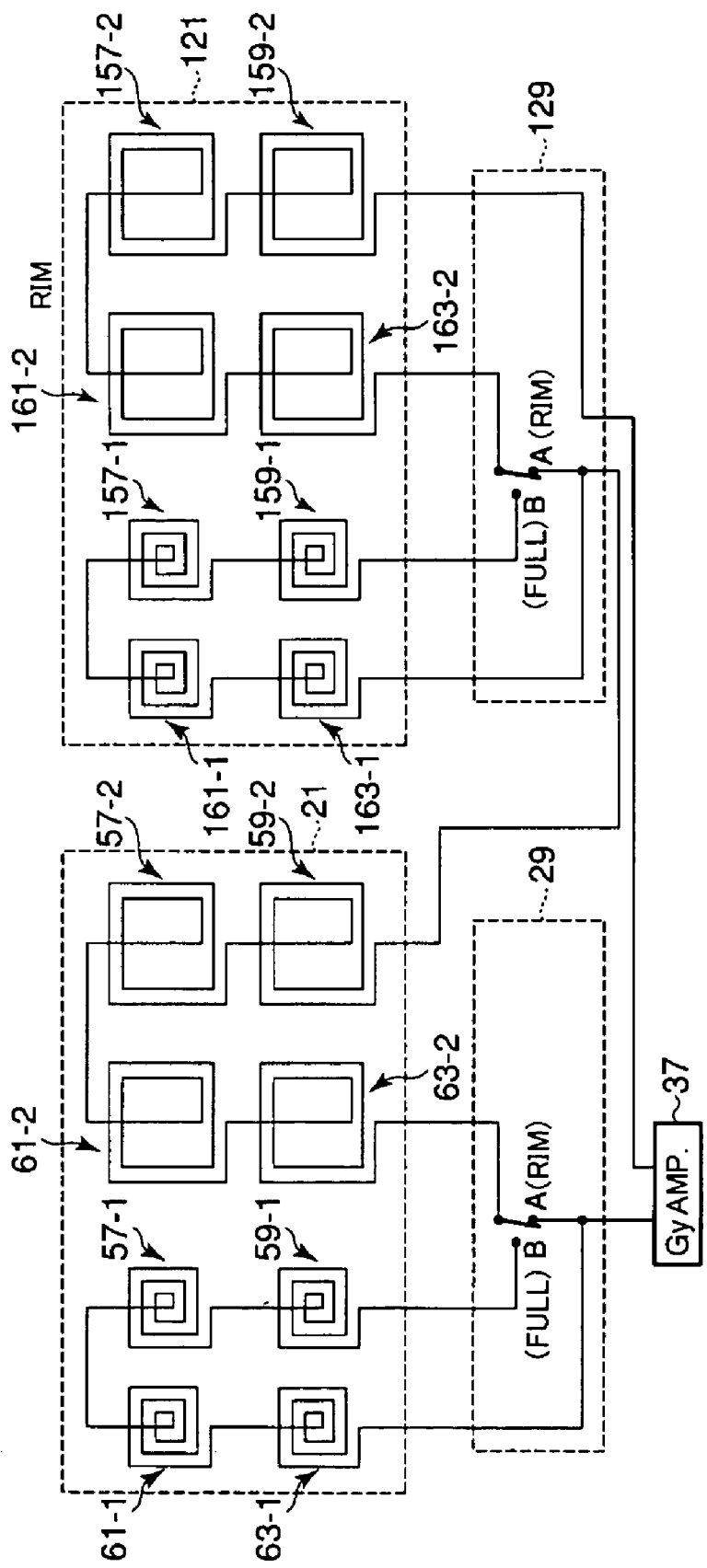
FIG. 14 is a schematic illustration of the Gy coil set of FIG. 1, a one-layer type shield coil, a mode changing switch and a Gy amplifier.
Figure 15:
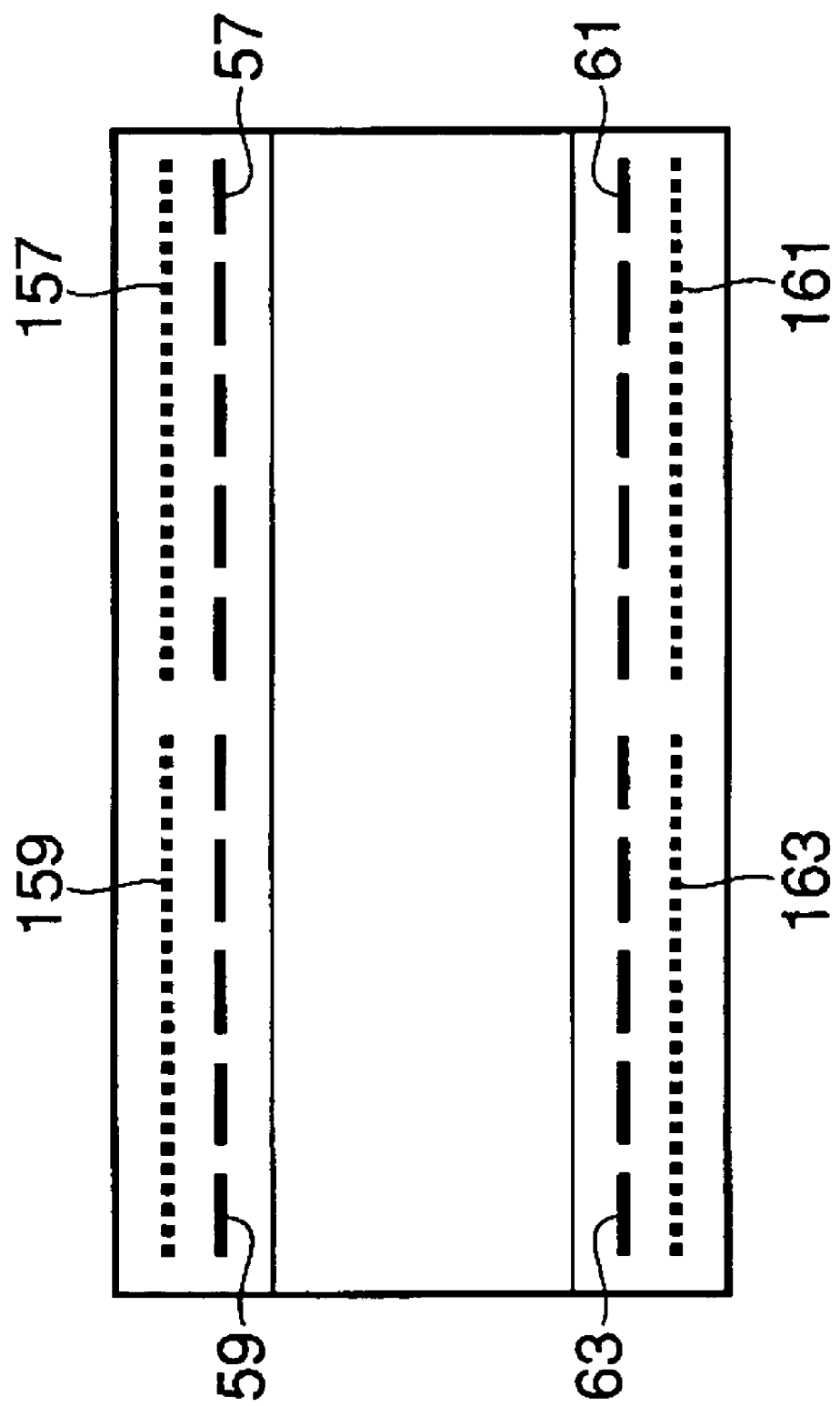
FIG. 15 is a schematic sectional view of the Gy coil of FIG. 14.
Figure 16:
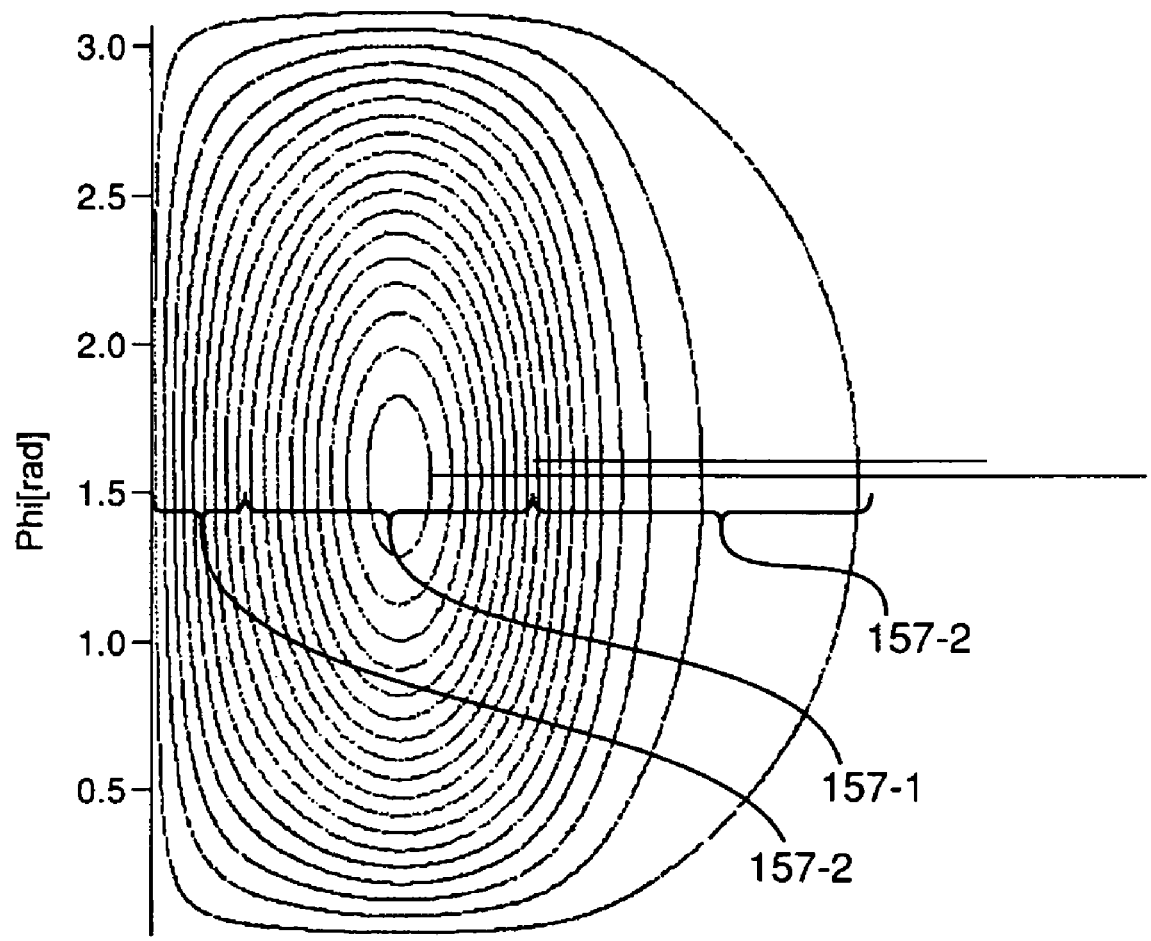
FIG. 16 is a schematic illustration of the coil winding pattern of the shield coil of FIG. 14.

Shield coil sets are also provided according to the Gx coil set 19, the Gy coil set 21 and Gz coil set 23, respectively. Thereby, the gradient coil unit 15 is made as the active shield gradient coil unit (ASGC). In the first embodiment, two types of ASGC are offered. In a first ASGC, a shield coil is located on a single layer (e.g., see FIG. 15). In a second ASGC, a shield coil is located on two layers (e.g., see FIG. 26). As shown in FIG. 14 and FIG. 16, the first ASGC has first shield coil parts 157-1, 159-1, 161-1 and 163-1 and second shield coil parts 157-2, 159-2, 161-2 and 163-2. The first shield coil parts 157-1, 159-1, 161-1 and 163-1 have approximate center parts of coil patterns to block leakage magnetic field from the first main coil parts 57-1, 59-1, 61-1 and 63-1. The first shield coil parts located outside the first main coil parts 57-1, 59-1, 61-1 and 63-1. The second shield coil parts 157-2, 159-2, 161-2 and 163-2 have peripheral parts of coil patterns to block leakage magnetic field from the second main coil parts 57-2, 59-2, 61-2 and 63-2. The second shield coil parts 157-2, 159-2, 161-2 and 163-2 are located outside the main coil parts 57-2, 59-2, 61-2 and 63-2. The first shield coil parts 157-1, 159-1, 161-1 and 163-1 are located on center parts of the shield coils, and the second shield coil parts 157-2, 159-2, 161-2 and 163-2 are located on peripheral parts of the shield coils. The second shield coil parts 157-2, 159-2, 161-2 and 163-2 surrounds the first shield coil parts 157-1, 159-1, 161-1 and 163-1.

Figure 17:
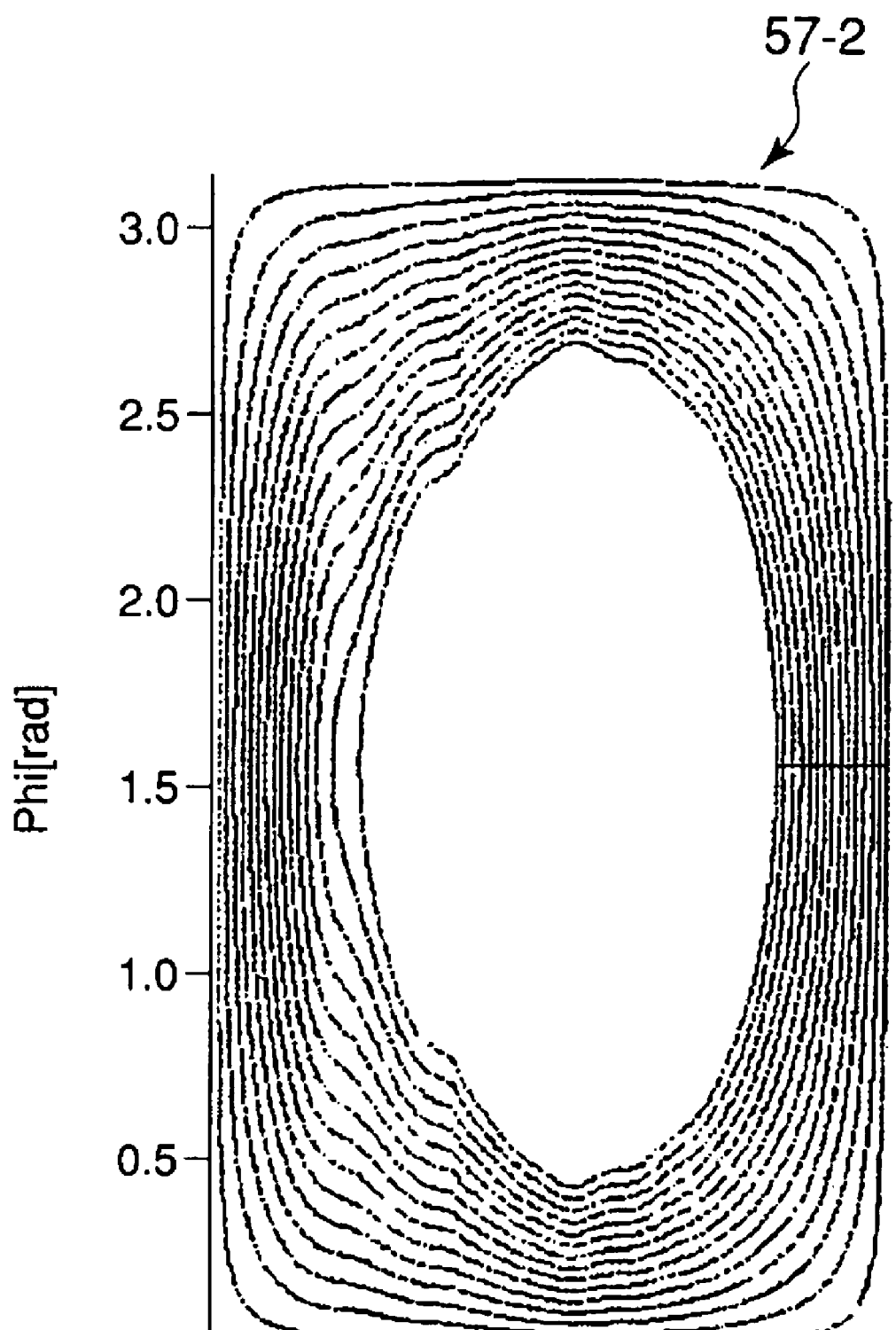
FIG. 17 is a schematic illustration of the coil winding pattern of the main coil part in a rim mode.
Figure 18:
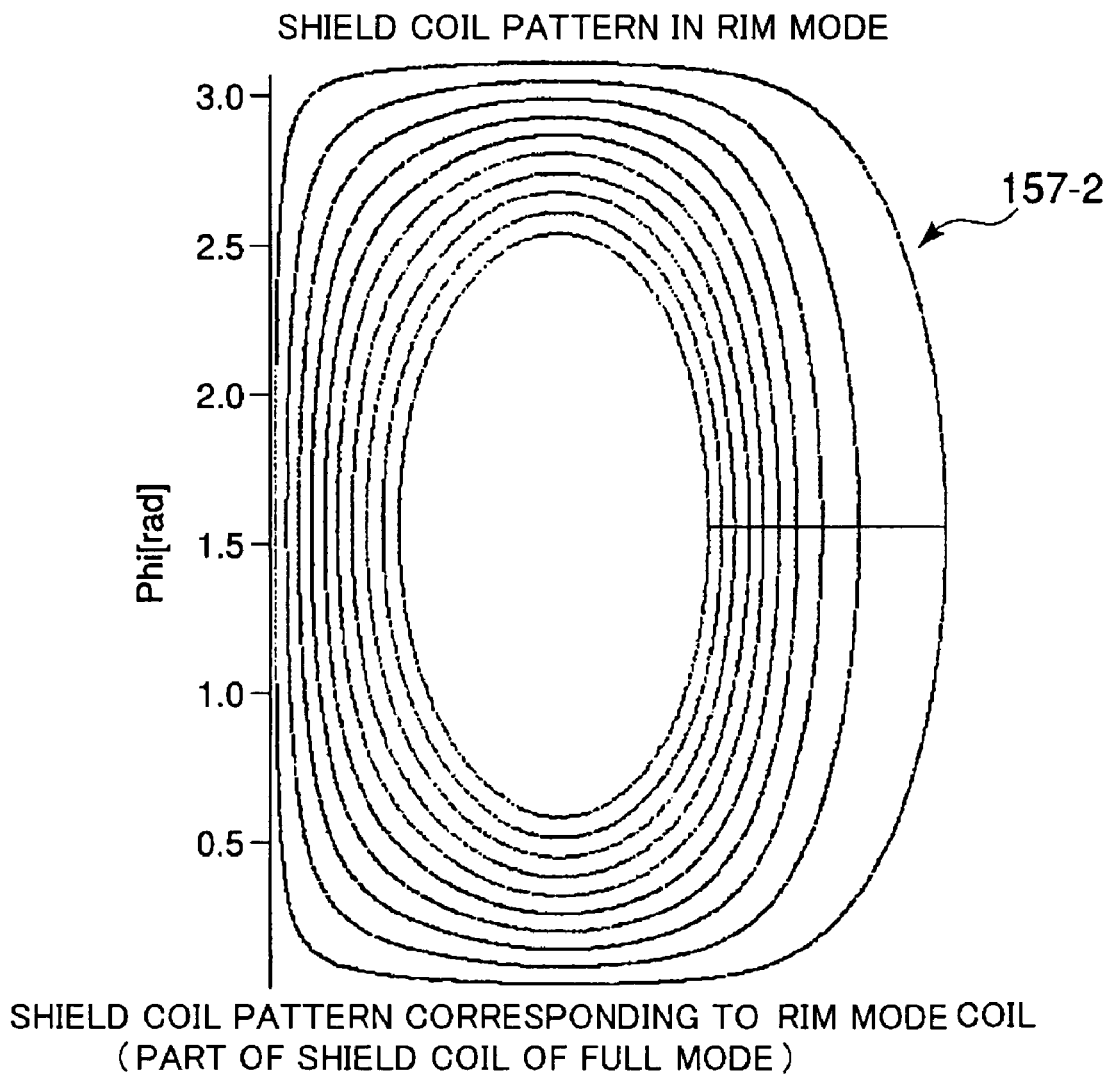
FIG. 18 is a schematic illustration of the coil winding pattern of the shield coil part in a rim mode.
Figure 19:
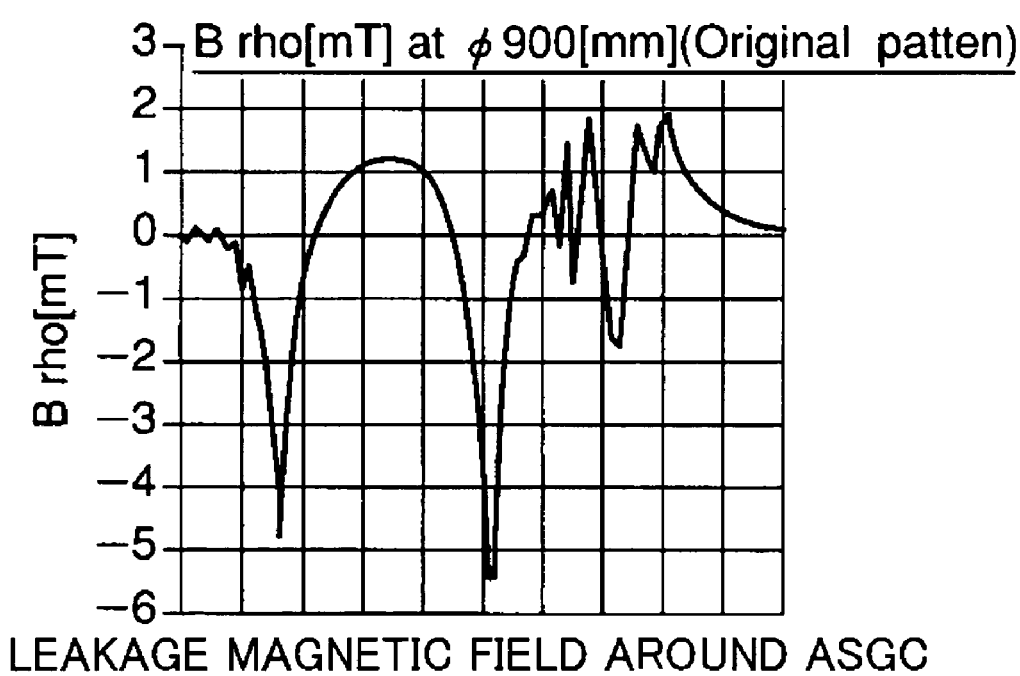
FIG. 19 is illustrates the spatial distribution of the leakage magnetic field in the rim mode.
Figure 20:
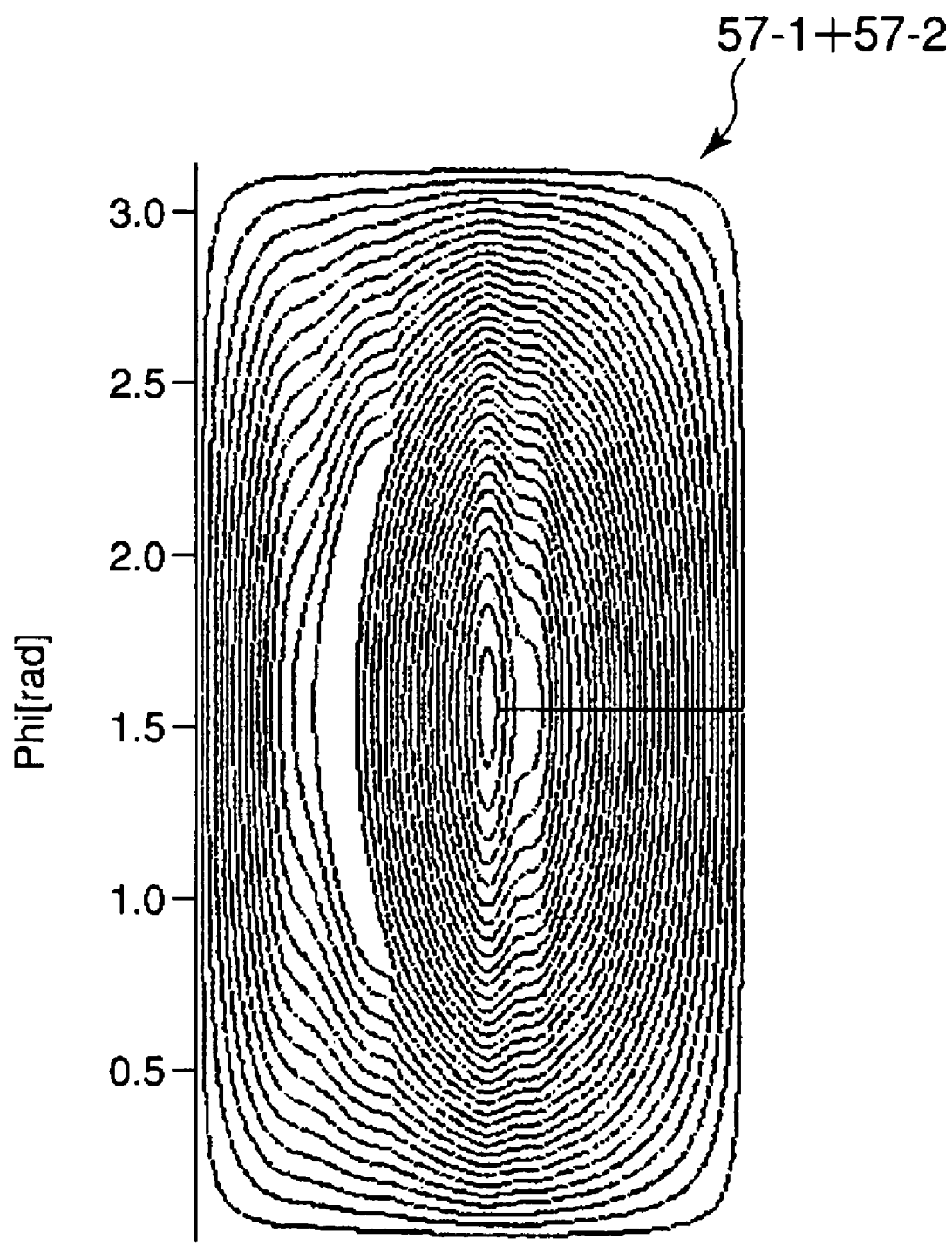
FIG. 20 is an illustration of the coil pattern of the main coil part in a full mode.
Figure 21:
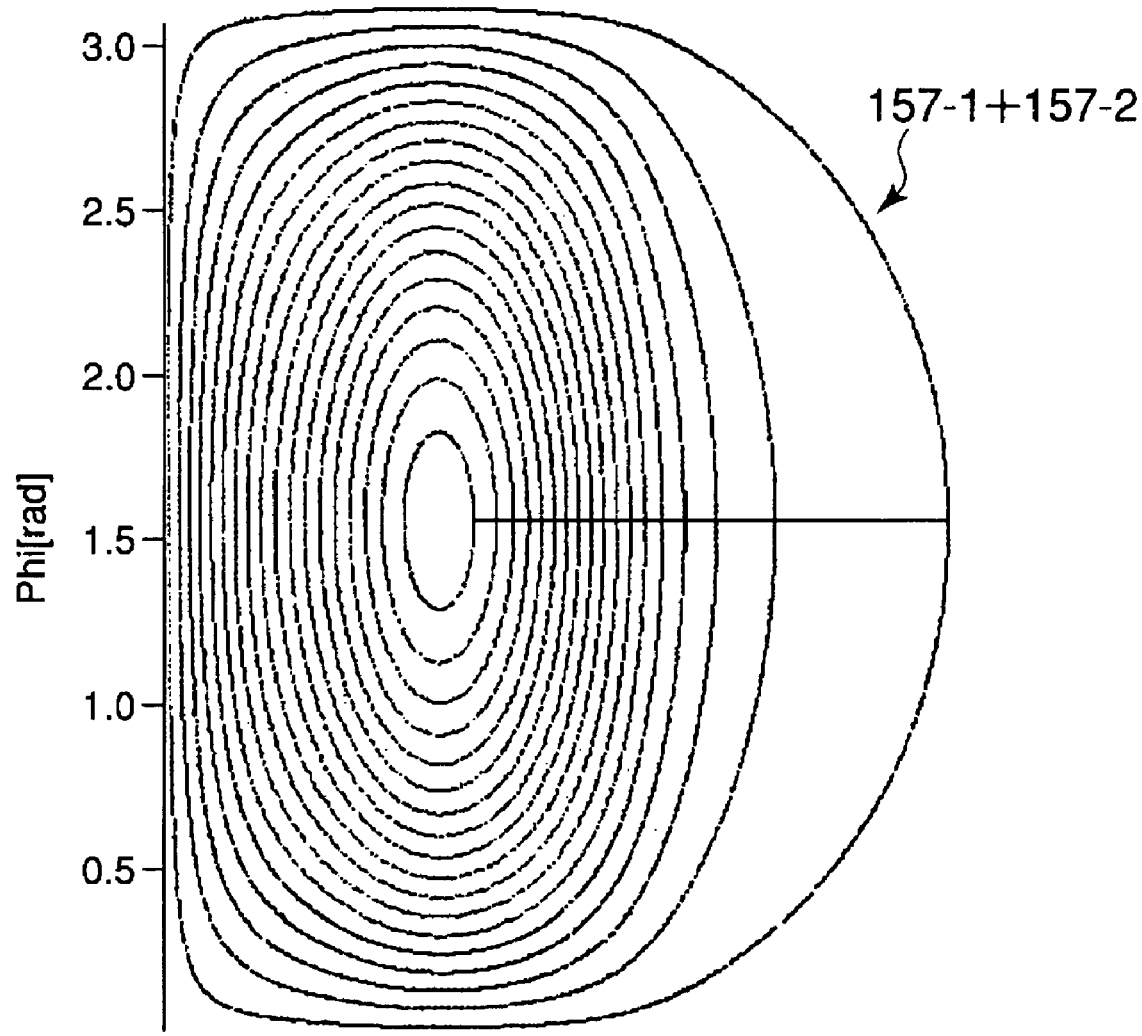
FIG. 21 is a schematic illustration of the coil winding pattern of a shield coil part in a full mode.
Figure 22:
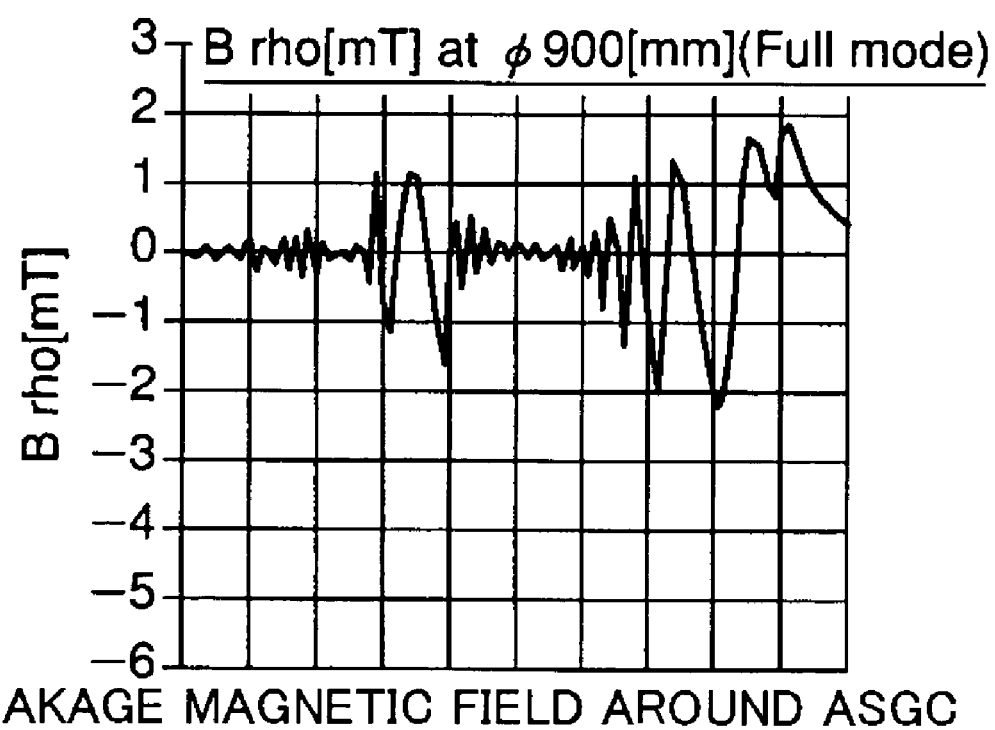
FIG. 22 illustrates the spatial distribution of the leakage magnetic field in the full mode.

A switch 129 works with the switch 29. When the switches 29 and 129 are connected to terminal B, Gy amplifier 37 is connected to the first and the second main coil parts 57-1, 59-1, 61-1, 63-1, 57-2, 59-2, 61-2 and 63-2, and to the first and second shield coil parts 157-1, 159-1, 161-1, 163-1, 157-2, 159-2, 161-2 and 163-2 in series (referred to FIG. 20, FIG. 21 and FIG. 22, Full mode). When the switches 29 and 129 are connected to terminal A, the Gy amplifier 37 is connected to the second main coil parts 57-2, 59-2, 61-2 and 63-2, and to the second shield coil parts 157-2, 159-2, 161-2 and 163-2 in series (referred to FIG. 17, FIG. 18 and FIG. 19, Rim mode). By changing a shield coil pattern together with the main coil pattern to the full mode or the rim mode, the shield effect can be improved in both modes.

Figure 23:
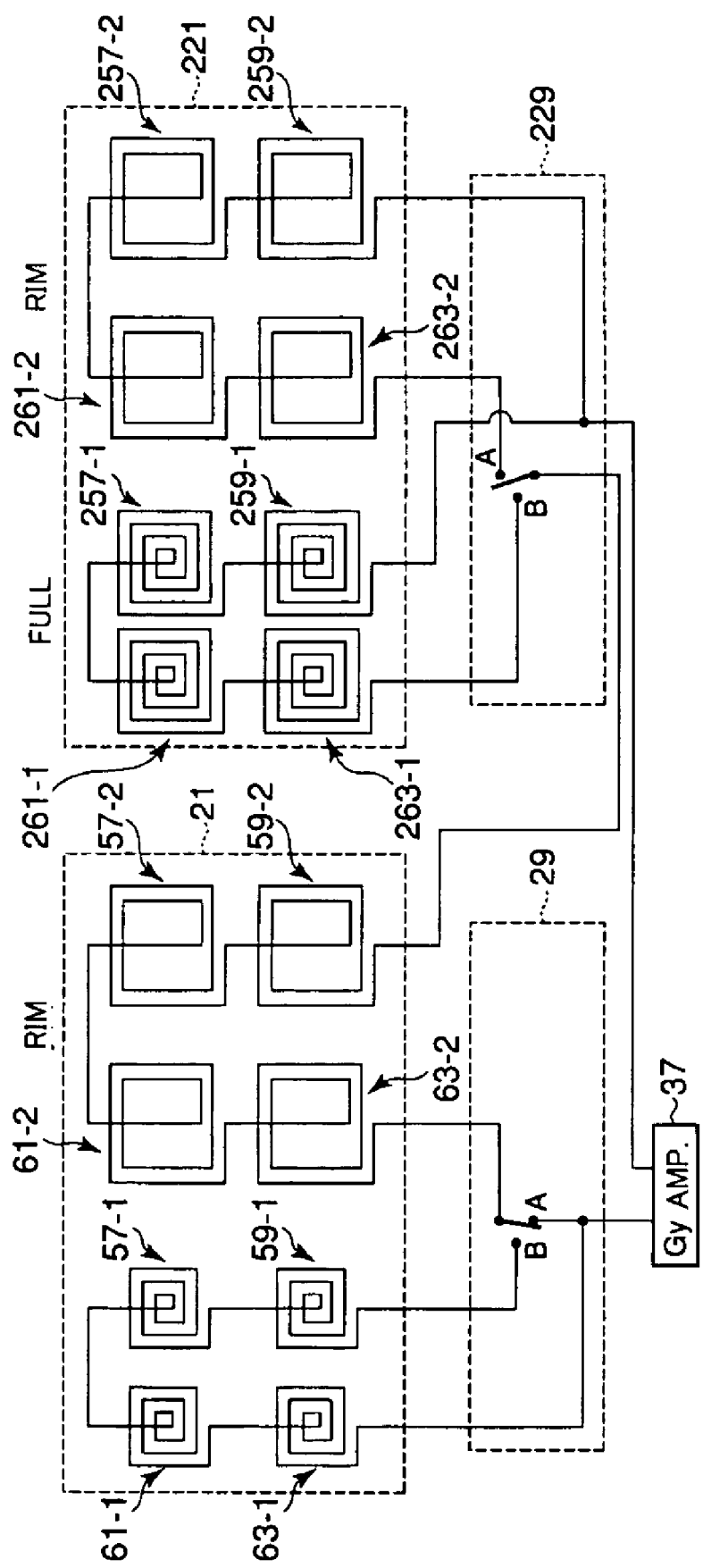
FIG. 23 is a schematic illustration of the Gy coil set of FIG. 1, a two-layer type shield coil, a mode changing switch and a Gy amplifier.
Figure 24:
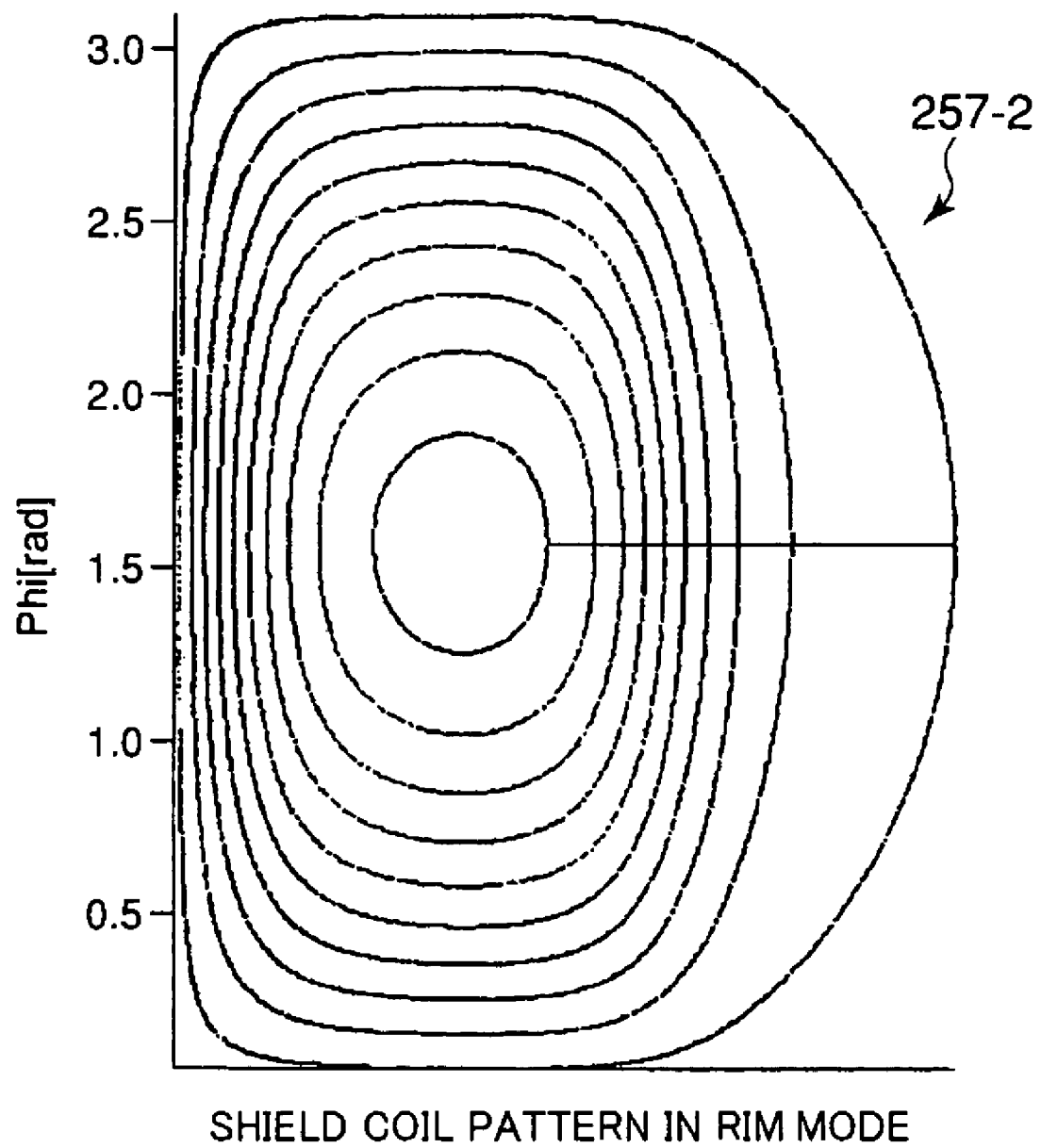
FIG. 24 is a schematic illustration of the coil winding pattern of the shield coil in the rim mode of FIG. 23.
Figure 25:
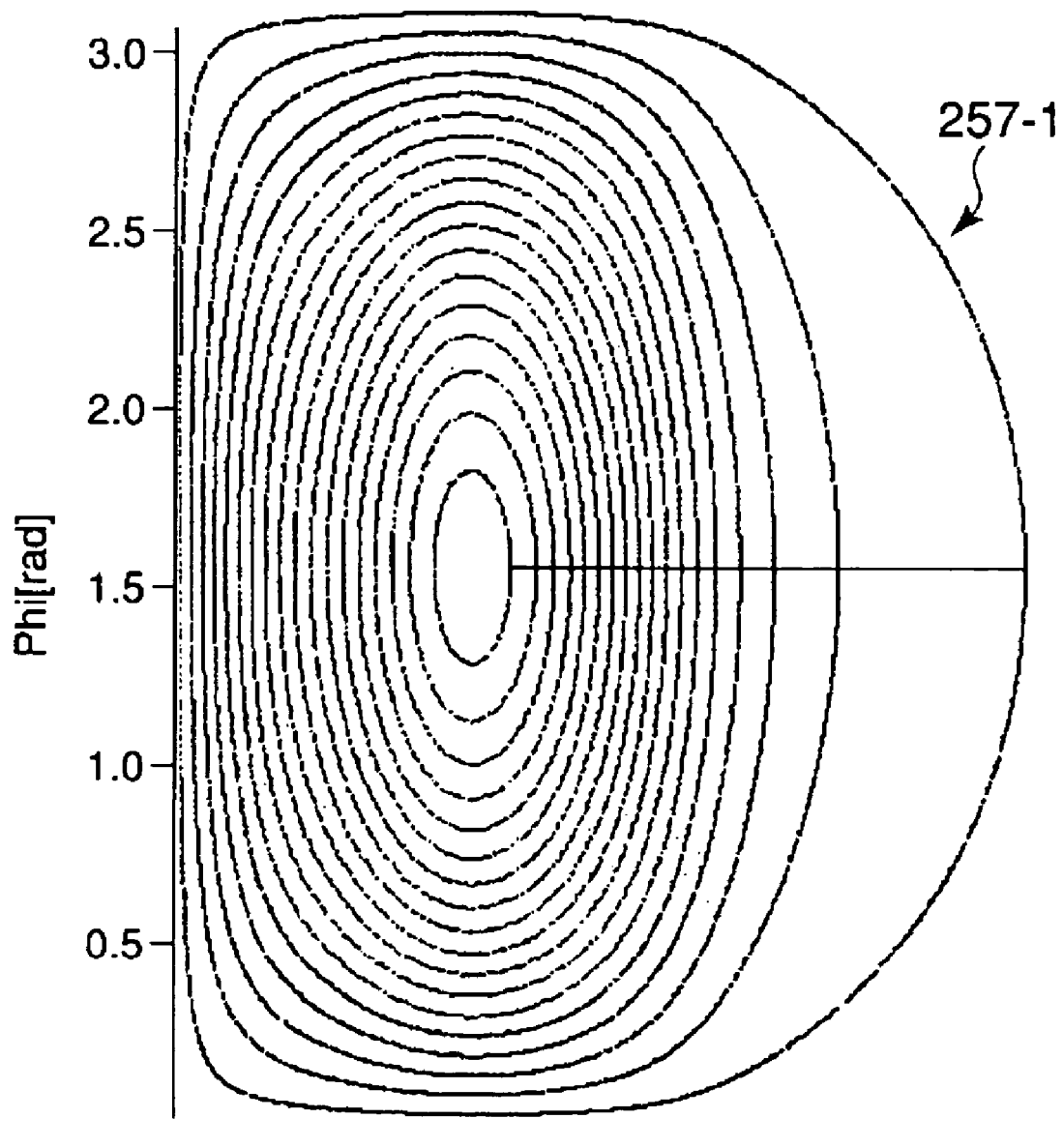
FIG. 25 is a schematic illustration of the coil winding pattern of the shield coil in the full mode of FIG. 23.

The second ASGC has the first shield coils 257-1, 259-1, 261-1 and 263-1 and the second shield coils 257-2, 259-2, 261-2 and 263-2 as shown in FIG. 23, FIG. 24 and FIG. 25. The first shield coils 257-1, 259-1, 261-1 and 263-1 have whole coil patterns to block leakage magnetic field from the first main coil parts 57-1, 59-1, 61-1 and 63-1. The first shield coils 257-1, 259-1, 261-1 and 263-1 are located outside the first main coil parts 57-1, 59-1, 61-1 and 63-1. The second shield coils 257-2, 259-2, 261-2 and 263-2 have whole coil patterns to block leakage magnetic field from the second main coil parts 57-2, 59-2, 61-2 and 63-2. The second shield coils 257-2, 259-2, 261-2 and 263-2 are located outside the second main coil parts 57-2, 59-2, 61-2 and 63-2.

Figure 26:
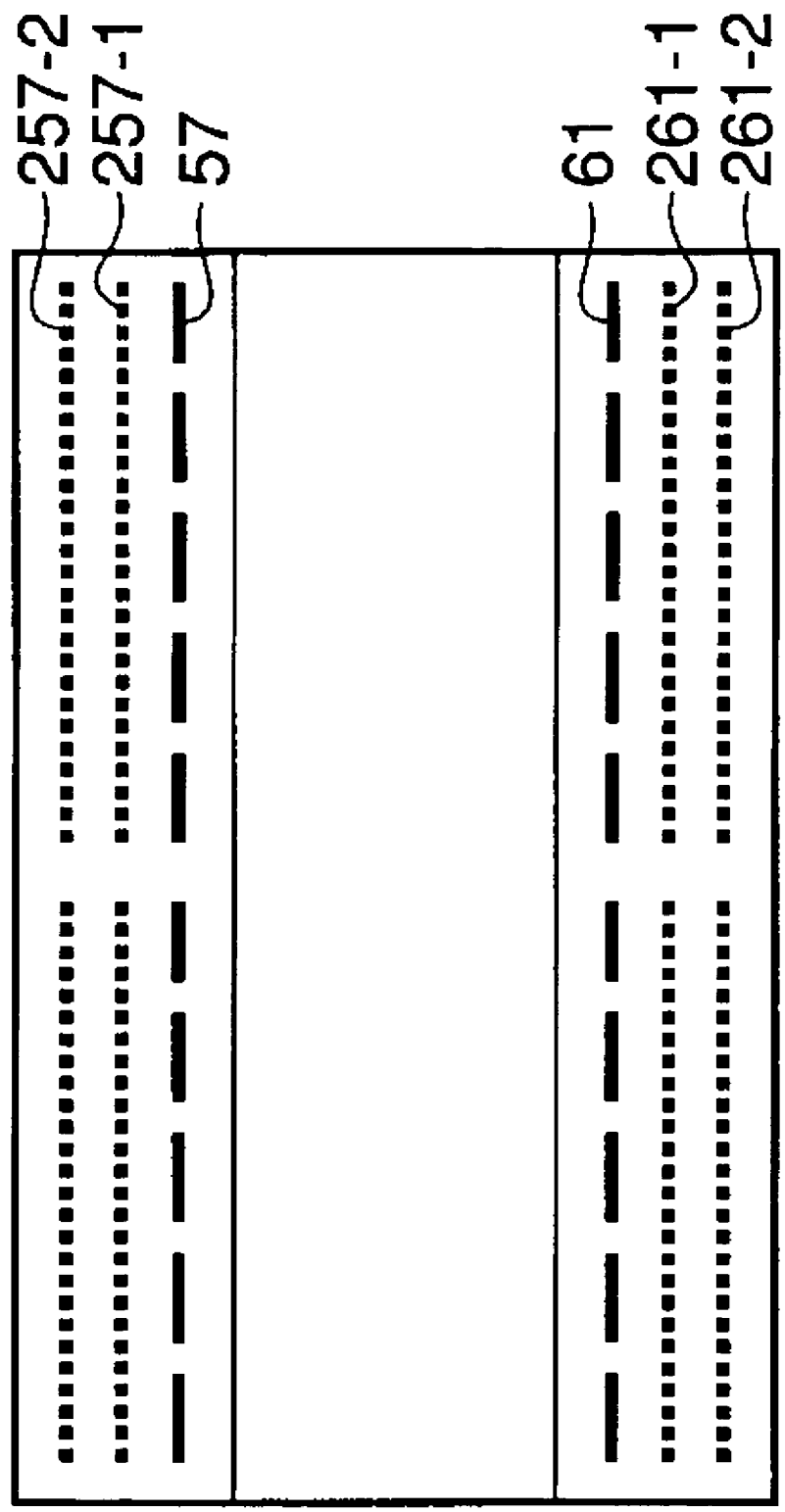
FIG. 26 is a sectional view of the Gy coil of FIG. 23.
Figure 30:
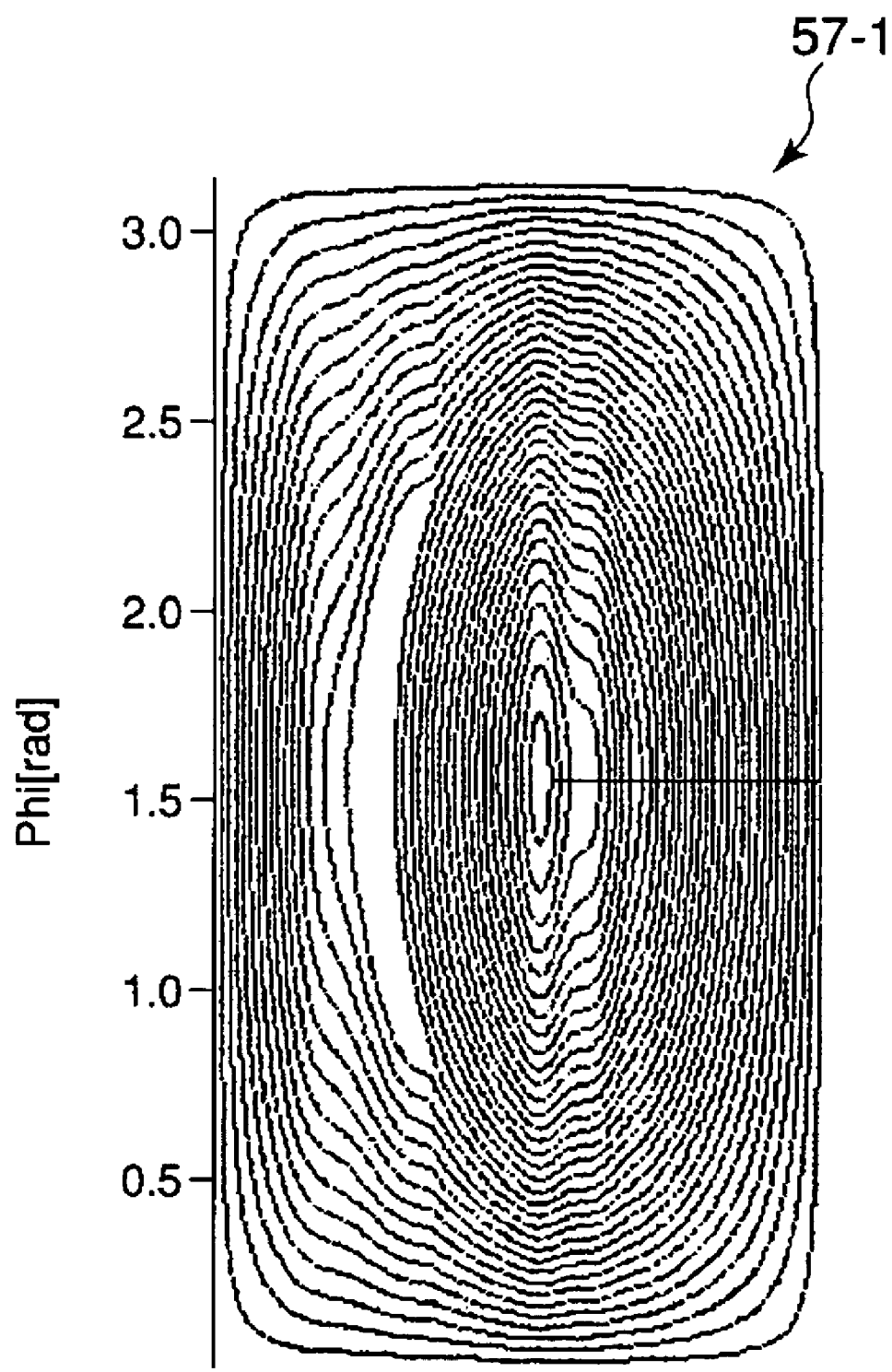
FIG. 30 is a schematic illustration of the coil winding pattern of the main coil part in a full mode using the shield coil of FIG. 23.
Figure 31:
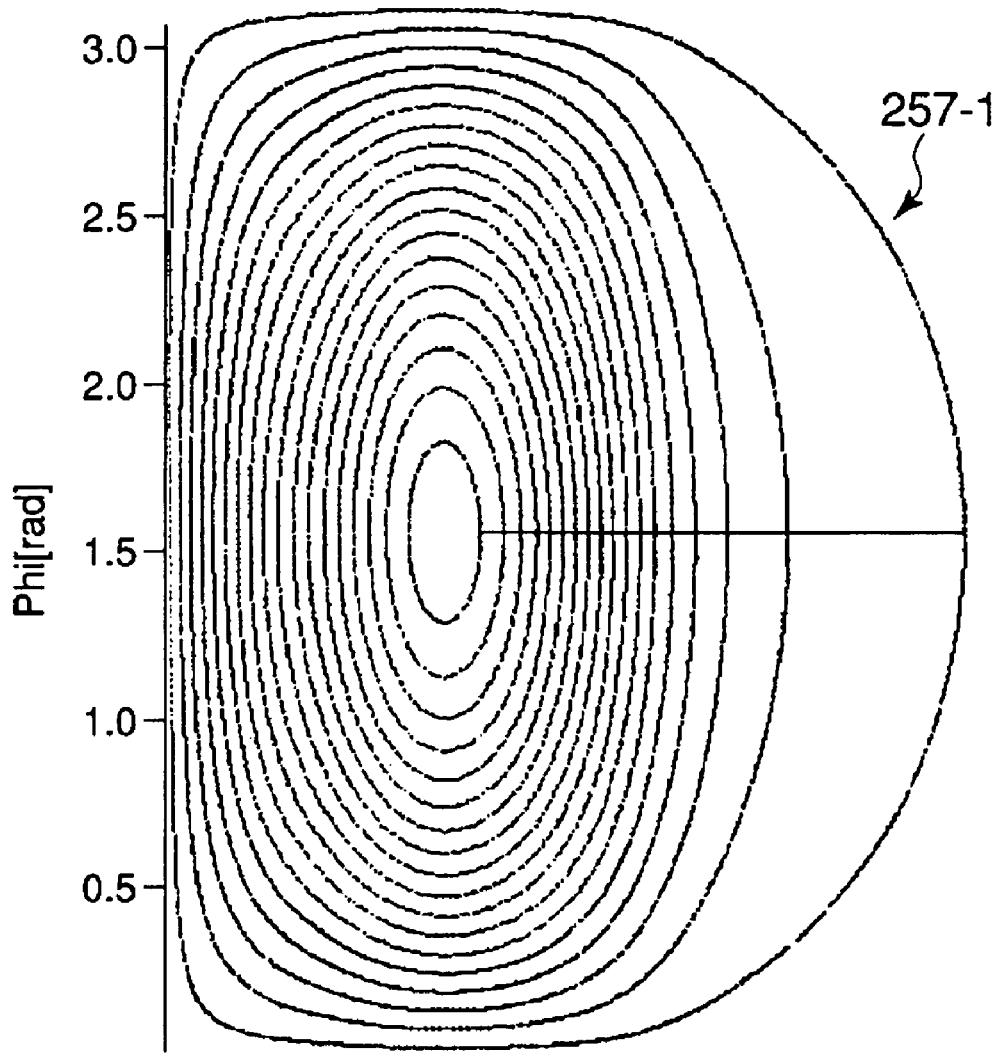
FIG. 31 is a schematic illustration of the coil winding pattern of the shield coil part in a full mode using the shield coil of FIG. 23.
Figure 32:
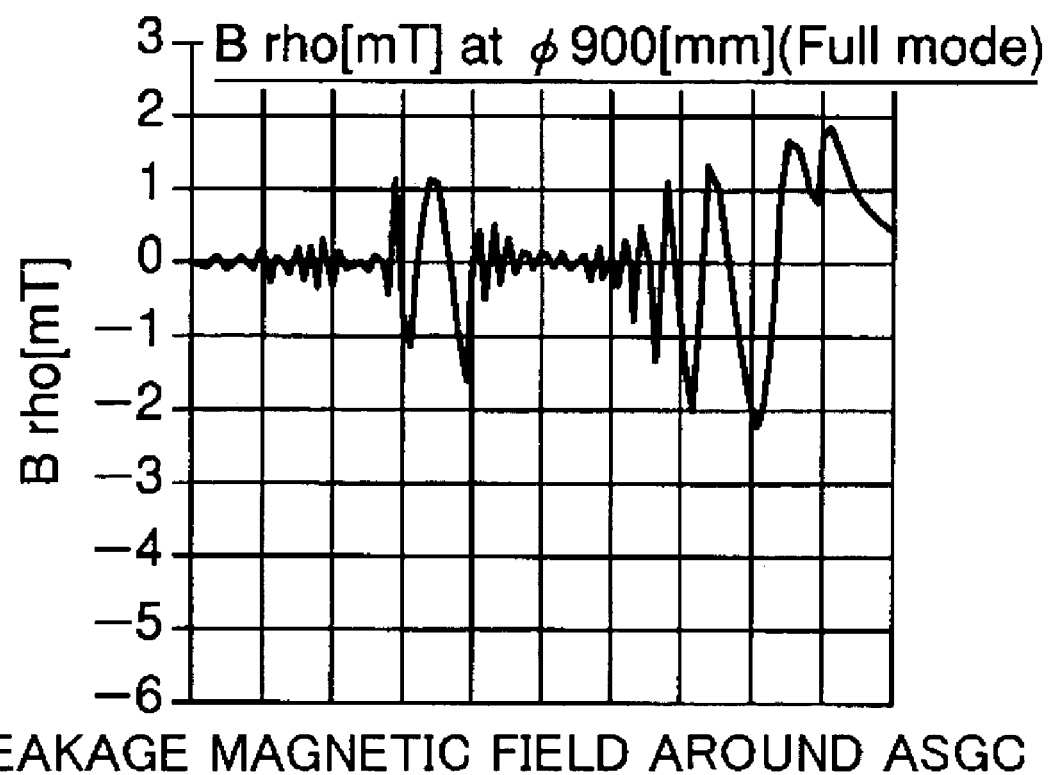
FIG. 32 illustrates the spatial distribution of the leakage magnetic field in the full mode using the shield coil of FIG. 23.

As shown in FIG. 26, first shield coils 257-1, 259-1, 261-1 and 263-1 are located on an outside layer of main coils 57, 59, 61, and 62, and second shield coils 257-2, 259-2, 261-2, 263-2 are located on an outside layer of the first shield coil 257-1, 259-1, 261-1 and 263-1. A switch 229 works with switch 29. When switches 29 and 229 are connected to terminal B, the first and the second main coil parts 57-1, 59-1, 61-1, 63-1, 57-2, 59-2, 61-2 and 63-2 and the first shield coils 257-1, 259-1, 261-1 and 263-1 are connected in series to Gy amplifier 37 (referred to FIG. 30, FIG. 31 and FIG. 32, Full mode).

Figure 27:
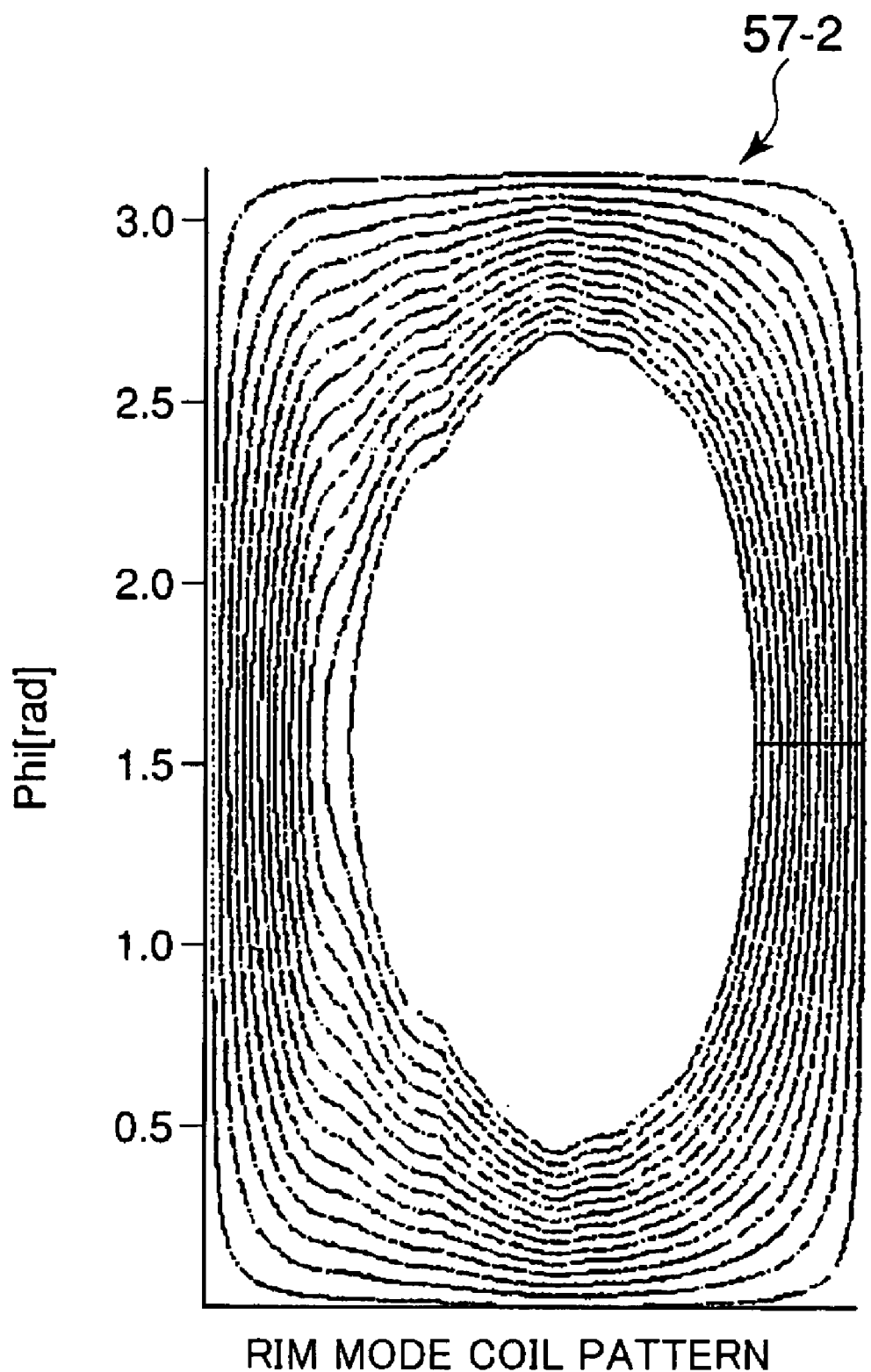
FIG. 27 is a schematic illustration of the coil winding pattern of the main coil part in a rim mode using the shield coil of FIG. 23.
Figure 28:
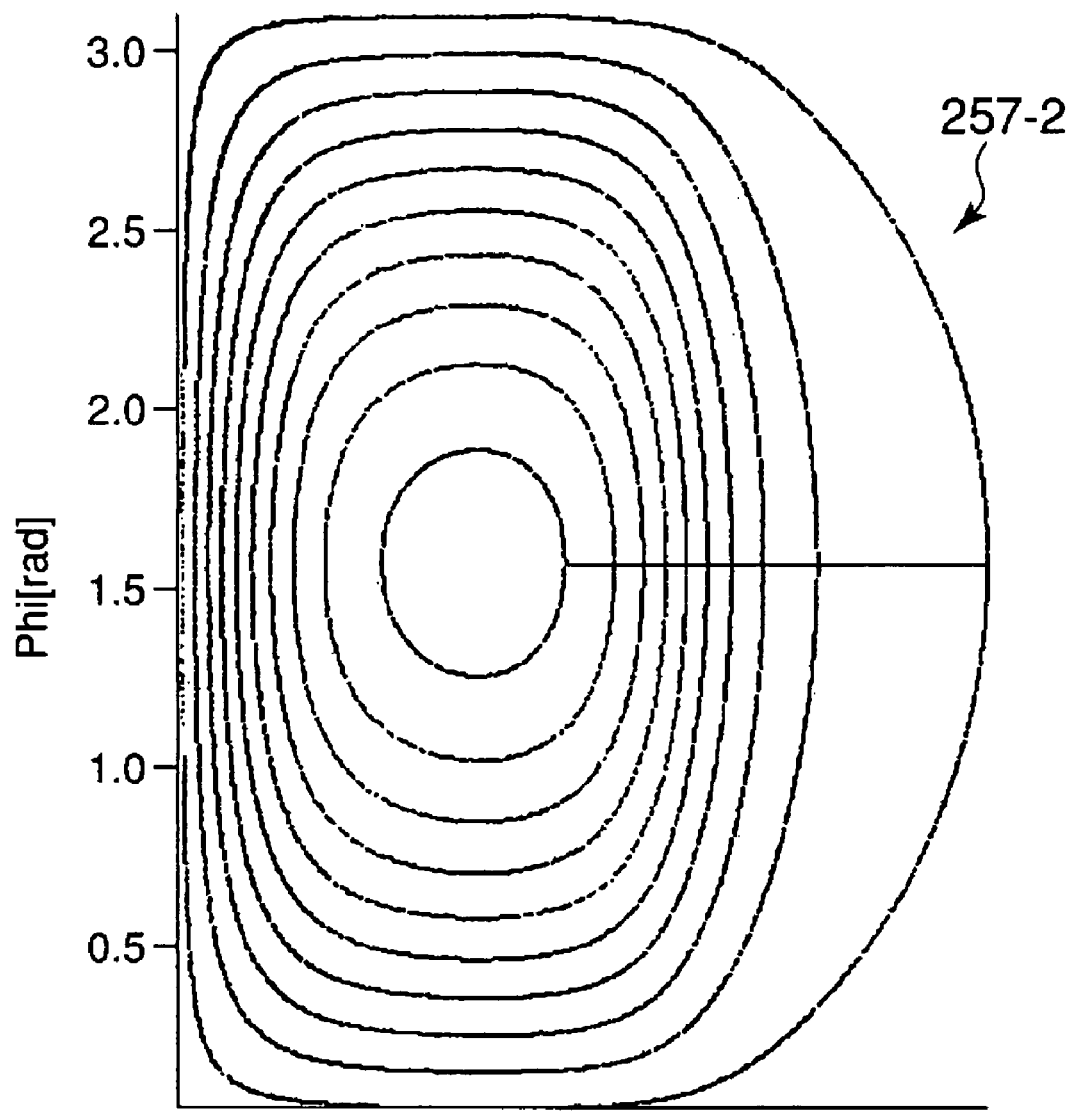
FIG. 28 is a schematic illustration of the coil winding pattern of the shield coil part in a rim mode using the shield coil of FIG. 23.
Figure 29:
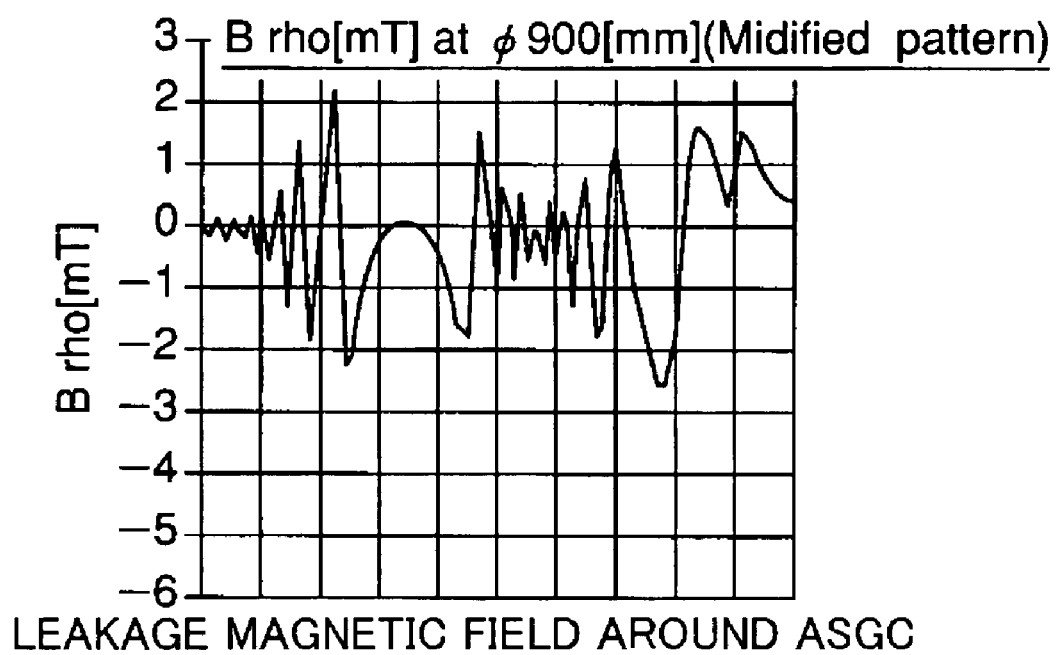
FIG. 29 illustrates the spatial distribution of the leakage magnetic field in the rim mode using the shield coil of FIG. 23.

When switches 29 and 229 are connected to terminal A, the Gy amplifier 37 is connected to second main coils 57-2, 59-2, 61-2 and 63-2, and second shield coils 257-2, 259-2, 261-2 and 263-2 in series (referred to FIG. 27, FIG. 28, and FIG. 29, Rim mode). By changing the shield coil pattern together with the main coil pattern between the full mode and the rim mode, the shield effect can be improved in the both modes. Since the second ASGC has the whole shield coil pattern, higher shield effect is achieved in comparison with the first ASGC. The improvement of the shield effect is remarkable in the rim mode, comparing FIG. 22 with FIG. 29.

Figure 33:
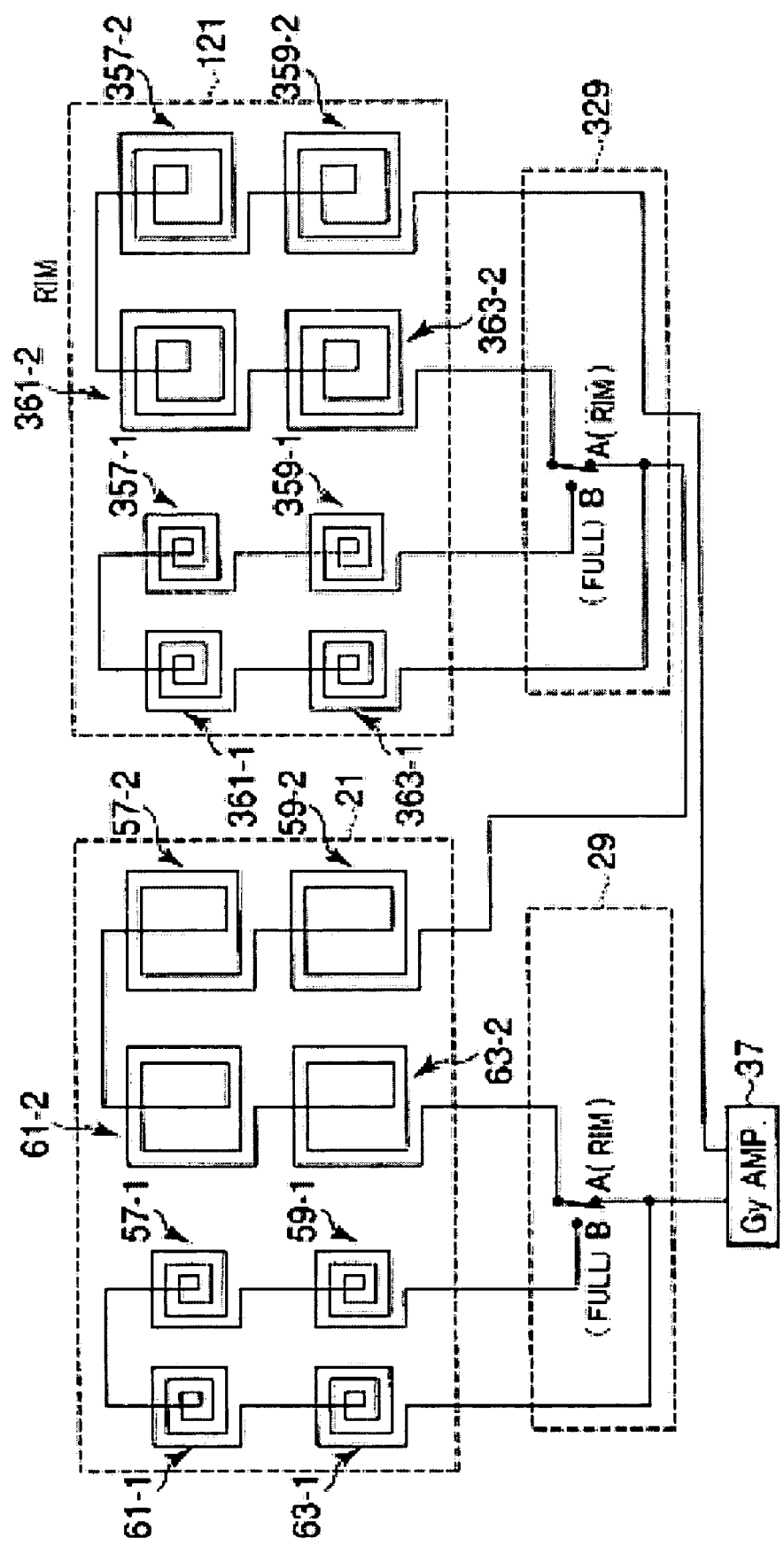
FIG. 33 is a schematic illustration of the coil winding pattern of the main coil part in a full mode using the shield coil of FIG. 23.
Figure 34:
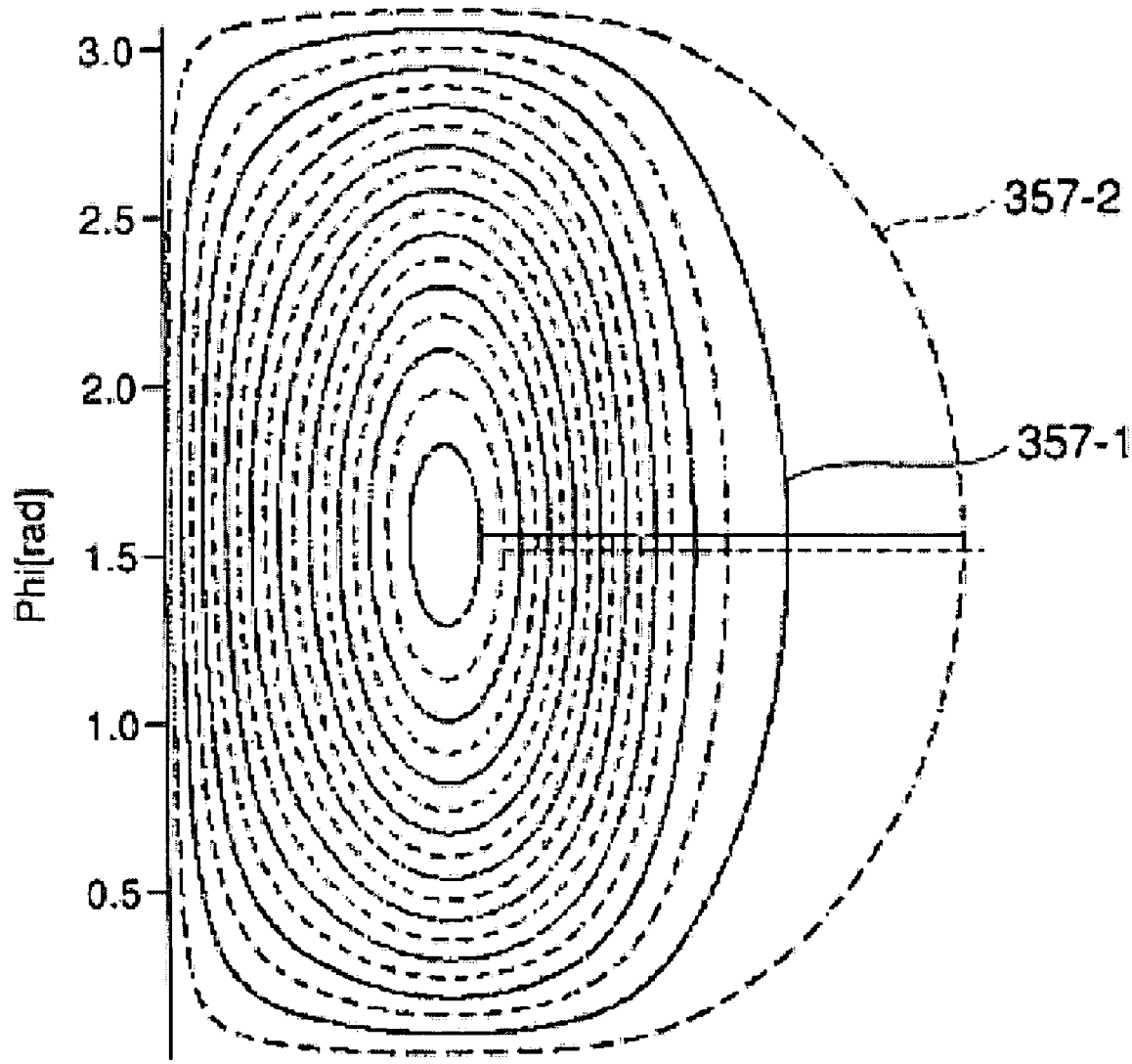
FIG. 34 is an illustration of the Gy coil set of FIG. 1, other one-layer type shield gradient coil set, a mode changing switch and a Gy amplifier.

As shown in FIG. 33, a third ASGC includes a first shield coil part 357-1, 359-1, 361-1 and 363-1 and a second shield coil part 357-2, 359-2, 361-2 and 363-2. As shown in FIG. 34, a second shield coil part 357-2 is electrically separated from the first shield coil part 357-1 so as to independently drive these shield coil parts. The first shield coil part 357-1 and the second shield coil part 357-2 are partially overlapped. The first shield coil part 357-1 and the second shield coil part 357-2 have coil patterns to shield leakage magnetic field from first main coil part 57-1 and second main coil part 57-2 which are simultaneously driven in the full mode. In other words, The first shield coil part 357-1 is created according to a part of the coil pattern that is created based on leakage magnetic field distribution from the first main coil part 57-1 and the second main coil part 57-2 that are simultaneously driven in the full mode. The second shield coil part 357-2 is created by a part of the coil pattern that is created so as to shield leakage magnetic field from the first and second main coil parts 57-1 and 57-2. A coil pattern of the second shield coil part 357-2 is approximately same as or similar to a coil pattern (referring to FIG. 24) created so as to shield leakage magnetic field from the second main coil part 57-2.

Figure 35:
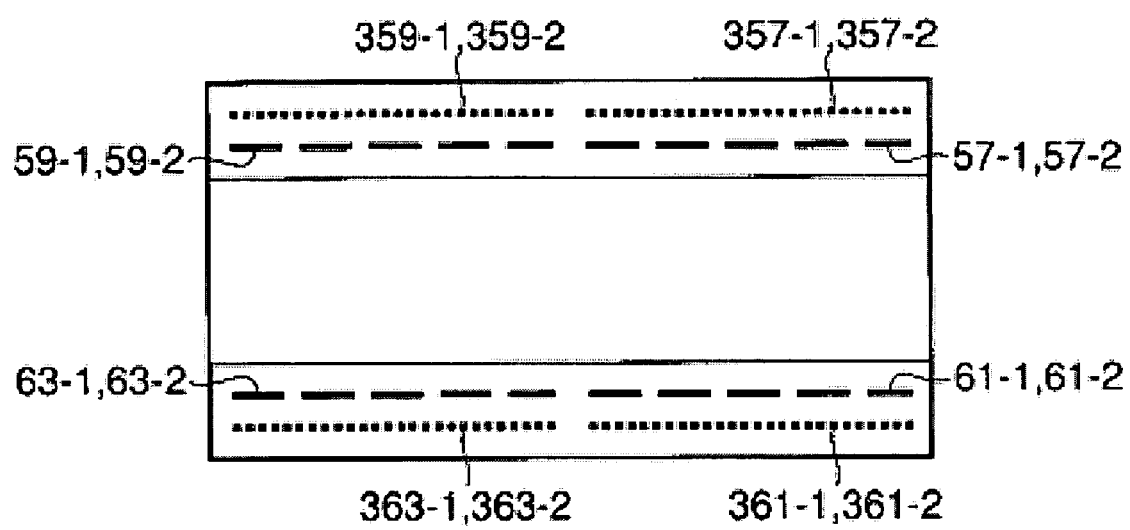
FIG. 35 is a sectional view of the Gy coil set of FIG. 33.

As shown in FIG. 35, the first and second shield coil parts 357-1, 357-2 are arranged on outside of the first and the second main coil parts 57-1 and 57-2 in a radial direction. The shield coil part 359-1 and 359-2 are created as well as the shield coil parts 357-1 and 357-2. The shield coil parts 361-1 and 361-2 are created as well as the shield coil parts 357-1 and 357-2. The shield coil parts 363-1 and 363-2 are created as well as the shield coil parts 357-1 and 357-2. Switch 329 works with switch 29. When switches 29 and 329 are connected to terminal B (full mode), the first and the second main coil parts 57-1, 59-1, 61-1, 63-1, 57-2, 59-2, 61-2 and 63-2 and the first and second shield coil parts 157-1, 159-1, 161-1, 163-1, 157-2, 159-2, 161-2 and 163-2 are connected to Gy amplifier 37 in series. Since the first and second shield coil parts 157-1 and 157-2 are optimized in order to shield leakage magnetic field from the first and the second main coil parts 57-1 and 57-2, it is possible to effectively shield leakage magnetic field from the first and the second main coil parts 57-1 and 57-2 that are simultaneously driven.

Figure 36:
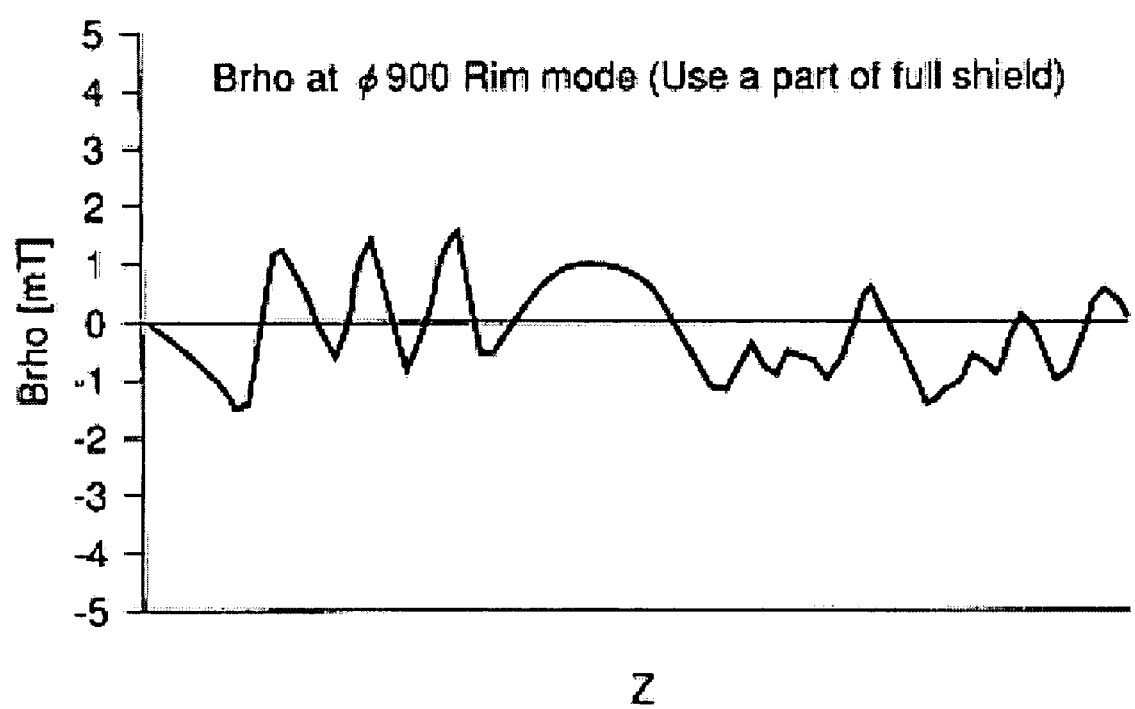
FIG. 36 illustrates the spatial distribution of the leakage magnetic field in the rim mode using the shield coil of FIG. 33.

When switches 29 and 329 are connected to terminal A (rim mode), the second main coil parts 57-2, 59-2, 61-2 and 63-2, and the second shield coil parts 357-2, 359-2, 361-2 and 363-2 are connected to Gy amplifier 37 in series. Since the second shield coil parts 357-2, 359-2, 361-2 and 363-2 have coil patterns approximated to the coil pattern designed in order to shield leakage magnetic field from the second main coil part 57-2, the leakage magnetic field can be efficiently shielded (referring to FIG. 36).

The third ASGC efficiently shields leakage magnetic field in both full mode and rim mode. In the full mode, since the shield pattern is designed according to leakage magnetic field distribution in the full mode, it is possible to efficiently shield leakage magnetic field. In the rim mode, although leakage magnetic field is shielded by using a part of the shield pattern of the full mode, since the part of the shield pattern is approximated to the shield pattern corresponding to leakage magnetic field distribution in the rim mode, it is also possible to sufficiently shield leakage magnetic field.

The present invention is not limited to the above described exemplary embodiments, and various modifications may be made without departing from the spirit or scope of the general inventive concept. It is therefore to be understood that within the scope of the appended claims, the present invention may be practised differently than as specifically described herein. Although the above embodiment and modifications include various steps or various elements, several steps or elements may be arbitrarily selected. For instance, some steps or elements described as the embodiment or modification may be omitted.

What is claimed is:
1. A gradient magnetic field coil unite including a plurality of gradient coils for generating gradient magnetic fields, each gradient coil comprising:
   a first gradient coil part; and
   a second gradient coil part having at least one of the following characteristics different than the corresponding characteristic of the first gradient coil part: (a) intensity of gradient magnetic field, (b) slew rate, (c) linearity and (d) changing rate of the magnetic field,
   wherein the first gradient coil part and the second gradient coil part of each gradient coil are both co-located on a single layer.
2. A gradient coil unit as in claim 2, wherein:
   the first gradient coil part of each gradient coil is located centrally within that gradient magnetic field coil; and
   the second gradient coil part of each gradient coil is located peripherally within that gradient magnetic field coil.

3. A gradient coil unit as in claim 2, further comprising:
a switching unit configured to switch at least one gradient coil between:
a first status where a first gradient coil part and a second gradient coil part are connected to an amplifier in series; and
a second status where the first gradient coil part is separated from the amplifier and the second gradient coil part is connected to the amplifier.

4. A gradient coil unit as in claim 2, wherein the second gradient coil part of at least one field coil has characteristics of lower intensity of gradient magnetic field, lower slew rate, higher linearity and higher changing rate of the magnetic field than the corresponding characteristics of the first gradient coil part.

5. A gradient coil unit as in claim 2, wherein the second gradient coil part of at least one field coil has lower winding density and fewer number of windings than the first gradient coil part.

6. A gradient coil unit according as in claim 2, further comprising a shield coil for at least one gradient coil, said shield coil including:
a first shield coil part corresponding to a first gradient coil part; and
a second shield coil part corresponding to a second gradient coil part.

7. A gradient coil unit as in claim 6, wherein the first shield coil part the second shield coil part are located on a single layer.

8. A gradient coil unit as in claim 7, further comprising:
a switching unit configured to switch at least one gradient coil between:
a first status where a first gradient coil part, a second gradient coil part, a first shield coil part and a second shield coil part are connected to an amplifier in series; and
a second status where the first gradient coil part and a first shield coil part are separated from the amplifier and a second gradient coil part and the second shield coil part are connected to the amplifier in series.

9. A gradient coil unit as in claim 2, further comprising:
a first shield coil corresponding to a first gradient coil part; and
a second shield coil corresponding to a second gradient part.

10. A gradient coil unit as in claim 9, wherein:
the first shield coil is located on a first layer; and
the second shield coil is located on a second layer radially outside of the first layer.

11. A gradient coil unit as in claim 9, further comprising a switching unit configured to switch at least one gradient coil between:
a first status where a second shield coil is separated from an amplifier and a first gradient coil part, a second gradient coil part and a second shield coil are connected to the amplifier in series; and
a second status where the first gradient coil part and a first shield coil are separated from the amplifier and the second gradient magnetic field coil part and the second shield coil are connected to the amplifier.

12. A gradient coil unit as in claim 2, further comprising a shield coil including a first shield coil part and a second shield coil part that are located on a single layer, wherein:
the shield coil has a coil pattern corresponding to a gradient coil including its first gradient coil part and its second gradient coil part connected to the first gradient coil part in series; and
the second shield coil part is connected to the first shield coil part in series and has a coil pattern approximating a shield coil pattern corresponding to the second gradient coil part.

13. A gradient coil unit as in claim 12, further comprising:
a switching unit configured to switch at least one gradient magnetic field coil between:
a first status where a first gradient coil part, a second gradient coil part, a first shield coil part and a second shield coil part are connected to an amplifier in series; and
a second status where the second gradient coil part and a second shield coil part are connected to the amplifier in series.

14. A gradient magnetic field coil unit as in claim 2, further comprising a shield coil including a first shield coil part and a second shield coil part that are located on a single layer, the first shield coil part overlapping to the second shield coil part.

15. A gradient coil unit as in claim 14, further comprising:
a switching unit configured to switch at least one gradient magnetic field coil between:
a first status where a first gradient coil part, a second gradient coil part, a first shield coil part and a second shield coil part are connected to an amplifier in series; and
a second status where the second gradient coil part and the second shield coil part are connected to the amplifier in series.

16. A magnetic resonance imaging apparatus, comprising:
a static magnetic field coil configured to impress a static magnetic field on an object;
a gradient coil unit including a plurality of gradient coils configured to impress gradient magnetic fields on the object;
an RF coil configured to receive a magnetic resonance signal from the object; and
an operation unit configured to create image data based on the magnetic resonance signal;
wherein each gradient coil comprises:
a first gradient coil part; and
a second gradient coil part having at least one of the following characteristics different than the corresponding characteristic of the first gradient coil part;
(a) intensity of gradient magnetic field, (b) slew rate, (c) linearity and (d) changing rate of the magnetic field
wherein the first gradient coil part and the second gradient coil part of each gradient coil are both co-located on a single layer.

17. A gradient magnetic field coil unit comprising:
a plurality of gradient coils configured to impress gradient magnetic fields on an object, each of which includes a first gradient coil part and a second gradient coil part that are located on a single layer; and
a plurality of shield coils, corresponding to the respective gradient coils, each of which includes a first shield coil part and a second shield coil part that are located on a single layer, the first shield coil part overlapping the second shield coil part.

18. A gradient coil unit as in claim 17, wherein:
a first shield coil part is connected to a corresponding second shield coil part in series;
the shield coil includes a shield coil pattern corresponding to the corresponding gradient coil including its first gradient coil part and its second shield coil part connected to the first gradient coil part in series; and the second shield coil part includes a shield coil pattern approximating a shield coil pattern corresponding to a second gradient coil part.

19. A magnetic resonance imaging apparatus comprising:
a gradient coil unit including a plurality of gradient coils configured to impress gradient magnetic fields on an object in a static magnetic field;
an RF coil configured to receive a magnetic resonance signal from the object; and
an operation unit configured to create image data based on the magnetic resonance signal;
wherein each the gradient coil comprises:
a first gradient coil part; and
a second gradient coil part having at least one of the characteristics of (a) intensity of gradient magnetic field, (b) slew rate, (c) linearity and (d) changing rate of the magnetic field that is different from the corresponding characteristics of the first gradient coil part part
wherein the first gradient coil part and the second gradient coil part of each gradient coil are both co-located on a single layer.

20. A magnetic resonance imaging apparatus comprising:
a plurality of gradient coils configured to impress gradient magnetic fields on an object in a static magnetic field, each of which gradient coils includes a first gradient coil part and a second gradient coil part that are located on a single layer;
a plurality of shield coils, corresponding to the respective gradient coils, configured to shield the gradient magnetic fields each of which shield coils includes a first shield coil part and a second shield coil part that are located on a single layer, the first shield coil part overlapping the second shield coil part;
an RF coil configured to receive a magnetic resonance signal from the object; and
an operation unit configured to create image data based on the magnetic resonance signal.

21. A gradient coil unit including a gradient coil for generating a gradient magnetic field, the gradient coil comprising:
a first portion centrally located within the gradient coil;
a second portion located outside of the first portion and having a lower winding density than the first portion; and
a third portion located outside of the second portion and having a higher winding density than the second portion.

22. A magnetic resonance imaging apparatus comprising:
a static magnetic field coil configured to impress a static magnetic field on an object;
a gradient coil unit including a gradient coil configured to impress a gradient magnetic field on the object;
an RF coil configured to receive a magnetic resonance signal from the object; and
an operation unit configured to create image data based on the magnetic resonance signal;
wherein the gradient coil comprises:
a first portion, centrally located within the gradient coil;
a second portion located outside of the first portion and having a lower winding density than the first portion; and
a third portion located outside of the second portion and which has a higher winding density than the second portion.

23. A method for MRI including switching a plurality of multi-mode gradient coil between a rim mode and a full mode wherein each gradient coil comprising:
a first gradient coil part; and
a second gradient coil part having at least one of the following characteristics different than the corresponding characteristic of the first gradient coil part: (a) intensity of gradient magnetic field, (b) slew rate, (c) linearity and (d) changing rate of the magnetic field, and
wherein said switching includes: switching at least one gradient coil between:
a first status where a first gradient coil part and a second gradient coil part are connected to an amplifier in series; and
a second status where the first gradient coil part is separated from the amplifier and the second gradient coil part is connected to the amplifier.

24. A method as in claim 23, wherein the first gradient coil part and the second gradient magnetic field coil part of each gradient coil are both co-located on a single layer.

25. A method as in claim 24, wherein:
the first gradient coil part of each gradient coil is located centrally within that gradient magnetic field coil; and
the second gradient coil part of each gradient coil is located peripherally within that gradient magnetic field coil.

26. A method as in claim 25, wherein the second gradient coil part of at least one field coil has characteristics of lower intensity of gradient magnetic field, lower slew rate, higher linearity and higher changing rate of the magnetic field than the corresponding characteristics of the first gradient coil part.

27. A method as in claim 25, wherein the second gradient coil part of at least one field coil has lower winding density and fewer number of windings than the first gradient coil part.

28. A method as in claim 25, further comprising concurrently switching a shield coil for at least one gradient coil, said shield coil including:
a first shield coil part corresponding to a first gradient coil part; and
a second shield coil part corresponding to a second gradient coil part.

* * * * *